United States Patent
Nakao et al.

(10) Patent No.: US 11,756,616 B2
(45) Date of Patent: Sep. 12, 2023

(54) COMPUTER AND CALCULATION METHOD USING MEMRISTOR ARRAY

(71) Applicant: FUJITSU LIMITED, Kawasaki (JP)

(72) Inventors: Hiroshi Nakao, Yamato (JP); Masayuki Hiromoto, Kawasaki (JP); Hisanao Akima, Kawasaki (JP); Teruo Ishihara, Sagamihara (JP); Takuji Yamamoto, Hachiouji (JP)

(73) Assignee: FUJITSU LIMITED, Kawasaki (JP)

( * ) Notice: Subject to any disclaimer, the term of this patent is extended or adjusted under 35 U.S.C. 154(b) by 183 days.

(21) Appl. No.: 17/522,959

(22) Filed: Nov. 10, 2021

(65) Prior Publication Data

US 2022/0270683 A1 Aug. 25, 2022

(30) Foreign Application Priority Data

Feb. 19, 2021 (JP) .................... 2021-025552

(51) Int. Cl.
  *G11C 7/02* (2006.01)
  *G11C 13/00* (2006.01)

(52) U.S. Cl.
  CPC ........ *G11C 13/0069* (2013.01); *G11C 13/004* (2013.01); *G11C 13/0026* (2013.01); *G11C 13/0028* (2013.01); *G11C 13/0038* (2013.01)

(58) Field of Classification Search
  CPC ............ G11C 13/0069; G11C 13/0026; G11C 13/0028; G11C 13/0038; G11C 13/004;
  (Continued)

(56) References Cited

U.S. PATENT DOCUMENTS

| 9,311,997 B2* | 4/2016 | Lee ..................... G11C 11/5657 |
| 2010/0080041 A1* | 4/2010 | Tonomura .......... G11C 13/0004 |
| | | 365/163 |

(Continued)

FOREIGN PATENT DOCUMENTS

| JP | 2020-35502 A | 3/2020 |
| WO | 2012/164926 A1 | 12/2012 |

OTHER PUBLICATIONS

Geethan Karunaratne et al., "In-memory Hyperdimensional Computing", arXiv:1906.01548v2 [cs.ET], pp. 1-16, Apr. 9, 2020 (Total 16 pages) Internet URL: https://arxiv.org/abs/1906.01548v2.

*Primary Examiner* — Hien N Nguyen
(74) *Attorney, Agent, or Firm* — Fujitsu Patent Center

(57) ABSTRACT

A computer includes: a memristor array including memristors arranged at intersections between word lines and a first bit line in the memristor array and at intersections between the word lines and second bit lines in the memristor array; an adder circuit configured to obtain sum voltages for the second bit lines by adding first voltages generated according to currents that flow in the second bit lines when a first pattern is supplied to the word lines to difference voltages between a reference voltage generated according to a current that flows in the first bit line when a second pattern is supplied to the word lines and second voltages generated according to currents that flow in the second bit lines when a second pattern is supplied to the word lines; and a detection circuit that detects a second bit line that corresponds to a maximum value of the sum voltages.

9 Claims, 14 Drawing Sheets

(58) Field of Classification Search
CPC ............ G11C 2213/77; G11C 13/0007; G11C 13/003; G11C 2013/0045; G11C 2013/009; G11C 7/02; G11C 7/062
See application file for complete search history.

(56) References Cited

U.S. PATENT DOCUMENTS

| | | |
|---|---|---|
| 2013/0114327 A1 | 5/2013 | Ikeda et al. |
| 2015/0170726 A1* | 6/2015 | Antonyan ........... G11C 11/1673 365/158 |
| 2017/0140815 A1* | 5/2017 | Yilmaz .............. G11C 13/0028 |
| 2018/0301187 A1* | 10/2018 | Ignowski ........... G11C 13/0002 |
| 2020/0075677 A1 | 3/2020 | Wada |
| 2020/0152266 A1* | 5/2020 | Lee .................... G11C 13/0069 |

\* cited by examiner

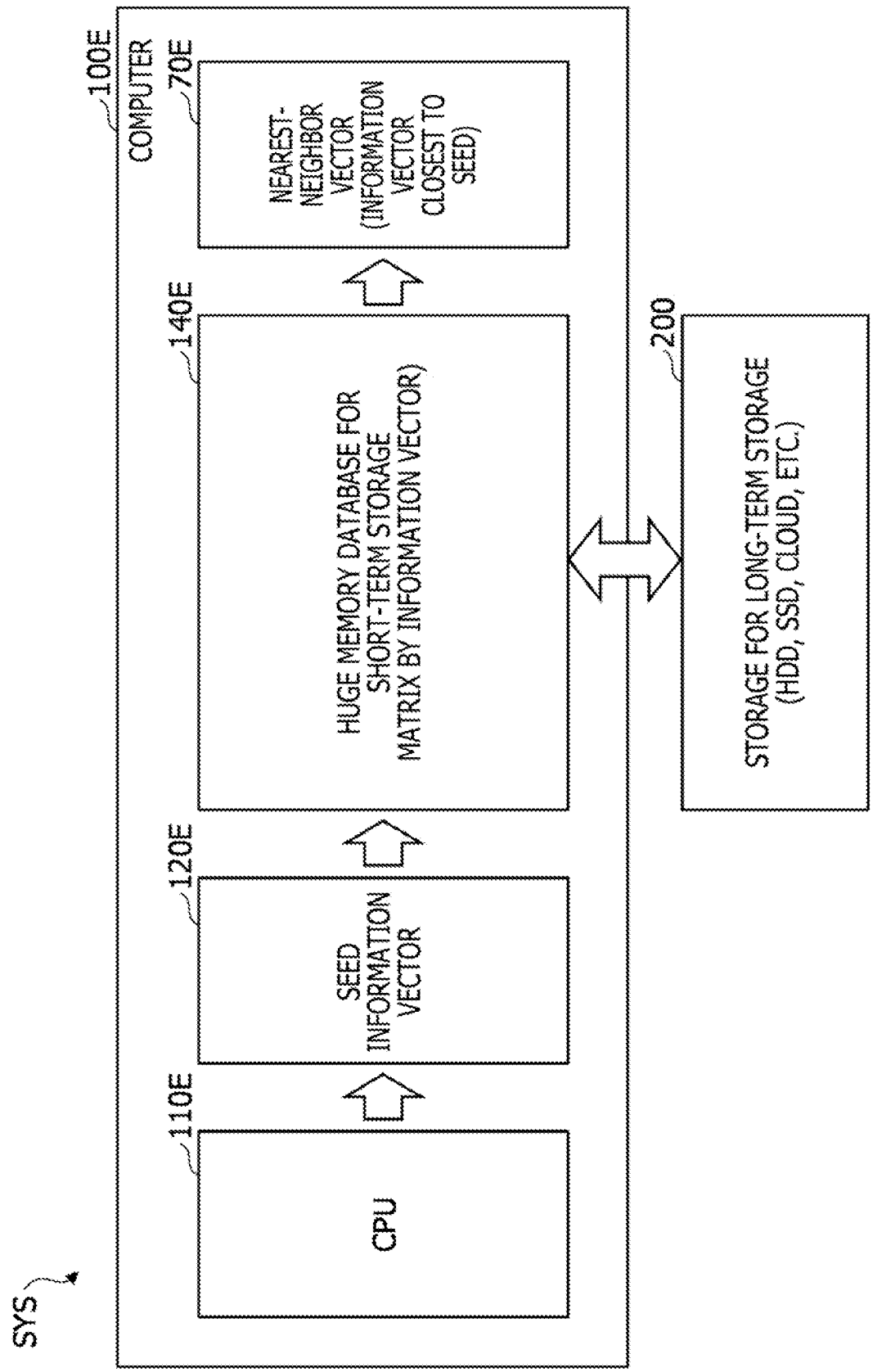

COMPUTER AND CALCULATION METHOD USING MEMRISTOR ARRAY

CROSS-REFERENCE TO RELATED APPLICATION

This application is based upon and claims the benefit of priority of the prior Japanese Patent Application No. 2021-25552, filed on Feb. 19, 2021, the entire contents of which are incorporated herein by reference.

FIELD

An embodiment relates to a computer equipped with a memristor array, and a calculation method using a memristor array.

BACKGROUND

A cross-point type memristor array in which a memristor a resistance value of which changes according to a current is arranged at an intersection between a word line and a bit line is known. A semiconductor integrated circuit including this type of memristor array switches correspondence between a value of an element of data represented by a matrix and a memory cell in a time division manner, and applies as a voltage of the word line to the memory cell array. Therefore, it becomes possible to implement a neural network in the memory cell array.

Furthermore, in a storage device including this type of memristor array, an initial break that resets the memory cells to a high-resistance state in order from a block farther from a selection circuit of the word line and the bit line among a plurality of blocks each including the memory cells is performed. Therefore, an influence of a leakage current is reduced.

Furthermore, a method of respectively supplying an input vector and an inversion vector thereof to word lines of a pair of memristor arrays each of which stores a vector to be compared with bit values inverted from each other, thereby searching for a nearest-neighbor vector is proposed.

Examples of the related art include as follows: Japanese Laid-open Patent Publication No. 2020-35502; International Publication Pamphlet No. WO 2012/164926; and Karunaratne et al., "In-memory hyperdimensional computing" arXiv:1906.01548v2 [cs.ET] 9 Apr. 2020, https://arxiv.org/abs/1906.01548v2.

SUMMARY

According to an aspect of the embodiments, there is provided a computer including: a memristor array including memristors, the memristors being arranged at intersections between a plurality of word lines and a first bit line in the memristor array and being arranged at intersections between the plurality of word lines and a plurality of second bit lines in the memristor array; an adder circuit configured to obtain sum voltages for the plurality of second bit lines by adding a plurality of first voltages to difference voltages, the plurality of first voltages being voltages generated according to currents that flow in the plurality of second bit lines when a first pattern is supplied to the plurality of word lines, the difference voltages being voltages between a reference voltage generated according to a current that flows in the first bit line when a second pattern is supplied to the plurality of word lines and a plurality of second voltages generated according to currents that flow in the plurality of second bit lines when a second pattern is supplied to the plurality of word lines; and a detection circuit configured to detect a second bit line that corresponds to a maximum value of the sum voltages.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 14 is a block diagram illustrating an example of a computer according to another embodiment.

DESCRIPTION OF EMBODIMENTS

Figure 1:
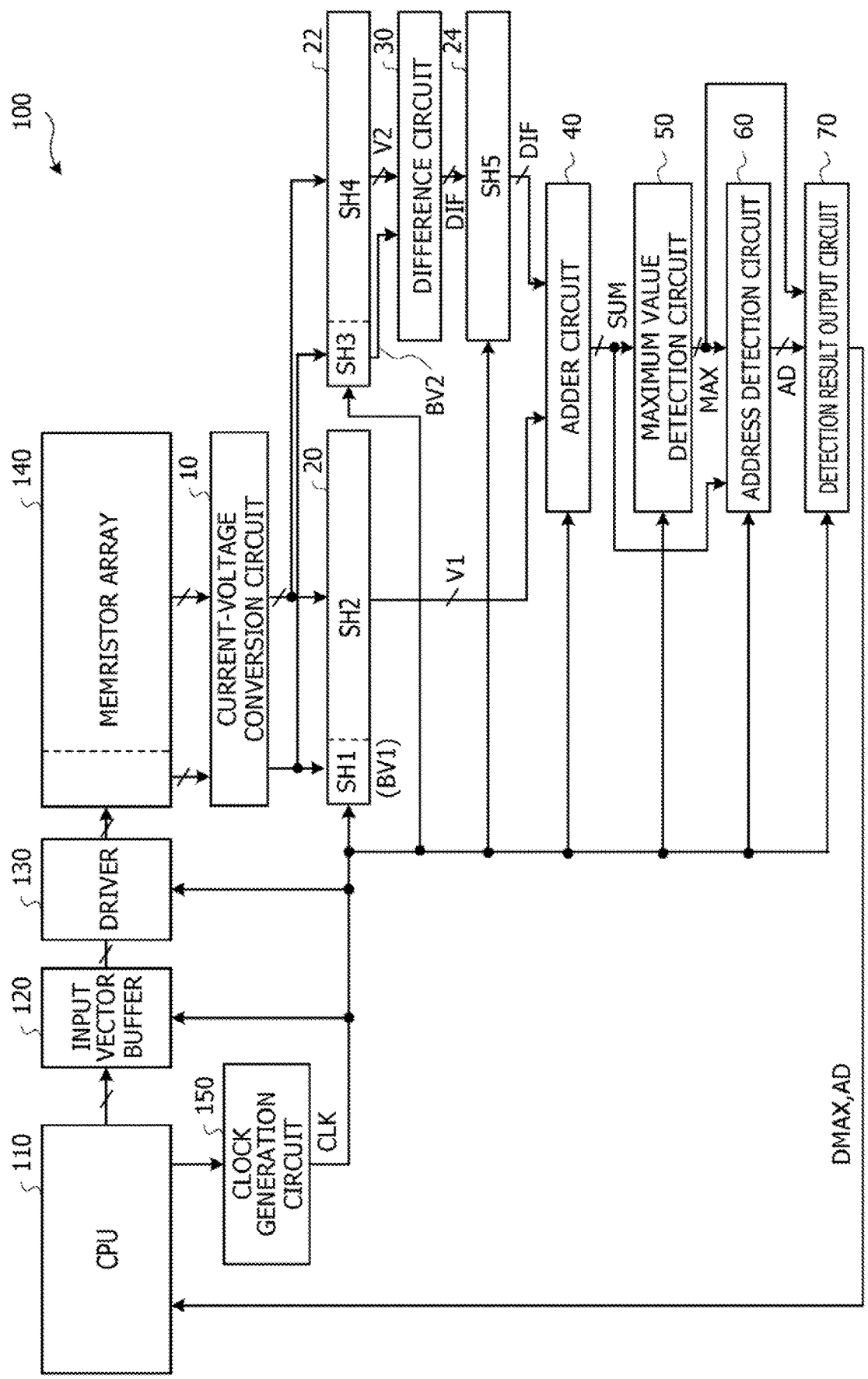
FIG. 1 is a block diagram illustrating an example of a computer according to one embodiment.

However, in a case where a nearest-neighbor vector closest to an input vector is detected by using two memristor arrays, a circuit scale increases. Moreover, in a case of converting a read current output from the memristor array to a digital value by an analog-to-digital converter (ADC) to compare, the more the vectors to be compared set in the memristor array, the larger the circuit scale.

In one aspect, an object of an embodiment is to reduce a circuit scale of a computer including a memristor array used to detect the nearest-neighbor vector.

Hereinafter, embodiments are described with reference to the drawings. Hereinafter, a signal line through which information such as a signal is transmitted is assigned with the same reference sign as a signal name. A diagonal line intersecting with the signal line in the drawing indicates that the signal line includes a plurality of bits. Note that, there is a case where the signal line indicated by a single line in the drawing includes a plurality of bits.

FIG. 1 illustrates an example of a computer according to an embodiment. A computer 100 illustrated in FIG. 1 is, for example, a server, a supercomputer, a personal computer (PC), or the like. The computer 100 includes a central processing unit (CPU) 110, an input vector buffer 120, a driver 130, a memristor array 140, and a clock generation circuit 150. Furthermore, the computer 100 includes a current-voltage conversion circuit 10, sample and hold circuits 20, 22, and 24, a difference circuit 30, an adder circuit 40, a maximum value detection circuit 50, an address detection circuit 60, and a detection result output circuit 70.

Figure 2:
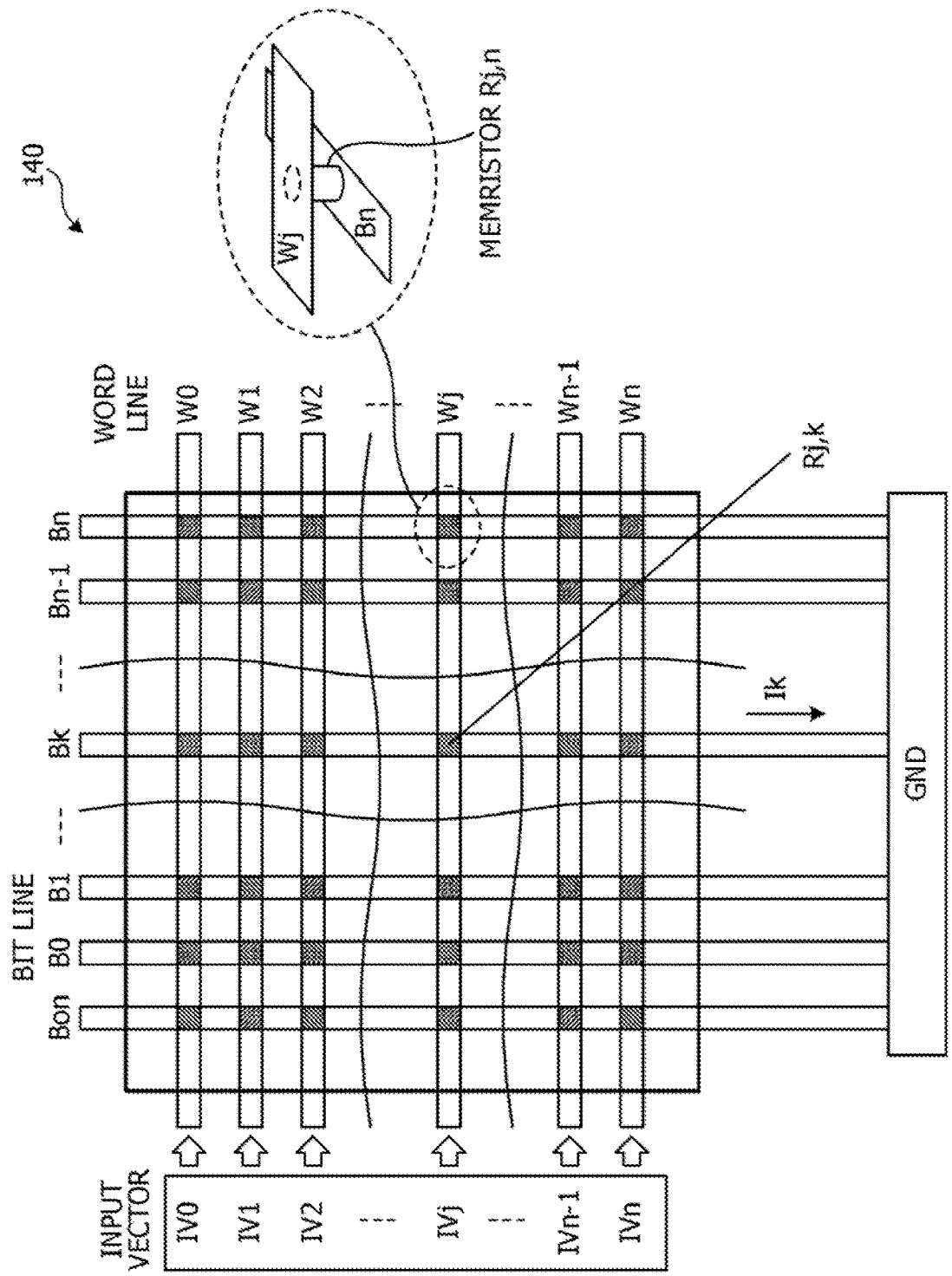
FIG. 2 is a block diagram illustrating an example of a memristor array in FIG. 1.

Although not especially limited, for example, the computer 100 may be realized by mounting a CPU chip including the CPU 110 and a memory chip including the memristor array 140 and other circuits on a substrate. At that time, the CPU chip and the memory chip may be stacked on the substrate. Note that, the memristor array 140 is formed on a wiring layer provided on a semiconductor substrate of the memory chip, and other circuits are formed by using the semiconductor substrate of the memory chip and the wiring layer. An example of the memristor array 140 is illustrated in FIG. 2.

The CPU 110 controls an entire operation of the computer 100 and detects a nearest-neighbor vector by using the memristor array 140. In other words, for example, the CPU 110 detects a vector closest to an input vector from a plurality of vectors held by the memristor array 140. Note that, a detection operation of the nearest-neighbor vector by the CPU 110 is executed by a program executed by the CPU 110. The CPU 110 outputs a plurality of types of clock signals CLK to clock synchronization circuits such as the sample and hold circuits 20, 22, and 24 in order to execute the detection operation of the nearest-neighbor vector.

The input vector buffer 120 holds the input vector to be detected transferred from the CPU 110. For example, a value of the input vector is represented by binary data of a plurality of bits. The input vector buffer 120 outputs the held input vector to the driver 130 on the basis of an instruction from the CPU 110. The driver 130 outputs a drive signal that allows the memristor array 140 to operate according to each bit value of the input vector received from the input vector buffer 120.

The memristor array 140 operates in response to the drive signal and outputs a current according to held data. For example, the memristor array 140 has a structure of a resistive random-access memory (ReRAM). Note that, the CPU 110 writes a plurality of vectors to be compared in the memristor array 140 in advance. A write operation is similar to a write operation of the resistive random-access memory.

The clock generation circuit 150 generates the clock signals CLK to be supplied to the driver 130 and the sample and hold circuits 20, 22, and 24 and the like, respectively, on the basis of control by the CPU 110. Note that, the clock generation circuit 150 may supply a common clock signal CLK to circuits that constantly operate.

The current-voltage conversion circuit 10 converts a current corresponding to each of a plurality of vectors to be compared output from the memristor array 140 into a voltage. The current-voltage conversion circuit 10 outputs the converted voltage to the sample and hold circuits 20 and 22.

The sample and hold circuit 20 includes a holding unit SH1 that holds a voltage BV1 corresponding to a first reference current, and a holding unit SH2 that holds each of voltages V1 corresponding to a plurality of vectors to be compared, respectively. The voltage BV1 is an example of a first reference voltage, and the voltage V1 is an example of a first voltage.

The holding unit SH2 is an example of a first holding circuit. The sample and hold circuit 20 holds the voltage BV1 and the voltage V1 by the holding units SH1 and SH2, in response to an instruction from the CPU 110, and outputs the voltage V1 for each vector held by the holding unit SH2 to the adder circuit 40. Note that, the voltage BV1 is not used in this embodiment, so that the sample and hold circuit 20 does not have to include the holding unit SH1.

The sample and hold circuit 22 includes a holding unit SH3 that holds a voltage BV2 corresponding to a second reference current, and a holding unit SH4 that holds each of voltages V2 corresponding to a plurality of vectors to be compared, respectively. The voltage BV2 is an example of a second reference voltage, and the voltage V2 is an example of a second voltage. The holding units SH3 and SH4 are an example of a second holding circuit. The sample and hold circuit 22 holds the voltage BV2 and the voltage V2 by the holding units SH3 and SH4, respectively, at a timing different from that of the sample and hold circuit 20 in response to an instruction from the CPU 110. The sample and hold circuit 22 outputs the voltage BV2 held by the holding unit SH3 and the voltage V2 for each vector held by the holding unit SH4 to the difference circuit 30.

The difference circuit 30 obtains differences between the voltage BV2 and a plurality of voltages V2 held by the holding unit SH4, respectively, and outputs obtained difference voltages DIF to the sample and hold circuit 24. The sample and hold circuit 24 includes a holding unit SH5 that holds the difference voltage DIF for each vector to be compared. The holding unit SH5 outputs the held difference voltages DIF to the adder circuit 40. The holding unit SH5 is an example of a third holding circuit.

The adder circuit 40 adds the voltages V1 for the respective vectors to be compared from the holding unit SH2 to the difference voltages DIF for the respective vectors to be compared from the holding unit SH5, respectively. The adder circuit 40 outputs sum voltages SUM for the respective vectors to be compared obtained by addition to the maximum value detection circuit 50 and the address detection circuit 60.

The maximum value detection circuit 50 detects a maximum voltage MAX out of the sum voltages SUM for the respective vectors to be compared. The maximum value detection circuit 50 outputs the detected maximum voltage MAX to the address detection circuit 60 and the detection result output circuit 70.

The address detection circuit 60 compares the sum voltages SUM for the respective vectors to be compared with the maximum voltage MAX, respectively. The address detection circuit 60 outputs information indicating a position of the memristor array 140 that holds the vector corresponding to the sum voltage SUM having the same value as that of the maximum voltage MAX to the detection result output circuit 70 as an address AD that identifies the nearest-neighbor vector. Note that, in a case where the address detection circuit 60 detects a plurality of sum voltages SUM of the same value as that of the maximum voltage MAX, in other words, for example, in a case where there is a plurality of nearest-neighbor vectors, this outputs the address AD for each detected sum voltage SUM. The maximum value detection circuit 50 and the address detection circuit 60 are an example of detection circuits that detect a bit line B (FIG. 2) corresponding to the maximum value of the sum voltage SUM.

The detection result output circuit 70 converts the maximum voltage MAX output from the maximum value detection circuit 50 into a digital value DMAX. Then, the detection result output circuit 70 outputs the digital value DMAX and the address AD to the CPU 110.

From above, the CPU 110 may detect the position of the memristor array 140 that holds the nearest-neighbor vector, and may determine a degree of similarity between the nearest-neighbor vector and the input vector. Furthermore, the CPU 110 may read the vector determined to be the nearest-neighbor vector from the memristor array 140 by using the address AD.

FIG. 2 illustrates an example of the memristor array 140 in FIG. 1. The memristor array 140 includes n+1 word lines W (W0 to Wn) extending in a lateral direction in FIG. 2 and n+2 bit lines B (Bon and B0 to Bn) extending in a longitudinal direction in FIG. 2. Furthermore, the memristor array 140 includes a memristor R that connects the word line W to the bit line B at an intersection between each word line W and each bit line B. In other words, for example, the memristor array 140 is of a so-called cross-point type.

Note that, the number of word lines W0 to Wn and the number of bit lines B0 to Bn may be different from each other. It is sufficient that the number of word lines W0 to Wn is larger than the number of bits of the input vector. The number of bit lines B0 to Bn corresponds to the number of vectors to be compared (patterns to be compared) that may be compared with the input vector at one time. The bit line Bon is an example of a first bit line, and the bit lines B0 to Bn are an example of second bit lines.

For example, the memristor R illustrated in FIG. 2 is of a variable resistance type having hysteresis in a current-voltage characteristic, and includes a conductor filament formed in an insulator. For example, the insulator is a metal oxide film of Si, Ti, Nb, and the like, and the conductor is a metal oxide including metal such as Ag and Nb or oxygen deficiency.

For example, the memristor R in which the filament is elongated due to application of a positive voltage equal to or larger than a predetermined value between electrodes is put into a low-resistance state. Furthermore, the memristor R in which the filament is cut due to application of a negative voltage equal to or larger than a predetermined value between electrodes is put into a high-resistance state. Then, in a write operation of data in the memristor array 140, each memristor R is set to the low-resistance state or the high-resistance state according to a voltage difference between the word line W and the bit line B.

In a read operation of reading the data from the memristor array 140, a current flowing in the memristor R when a voltage that does not change the resistance state is applied between the electrodes of the memristor R is detected. Hereinafter, it is described assuming that the low-resistance state is a logical value 1/on state (on), and the high-resistance state is a logical value 0/off state (off).

The resistance state of the memristor R does not change in a case where no voltage is applied between the electrodes. Therefore, the memristor array 140 may be used as a nonvolatile memory that does not consume power for holding the data. Furthermore, since a storage element may be formed in the wiring layer, mounting density of the memory may be made higher than that of an SRAM, a flash memory, and the like in which the storage element is formed of a transistor. For example, in a case where a wiring rule is F, a size used for storing one bit is $4F^2$. In other words, for example, by using the memristor array 140, it is possible to realize an ultra-high density and ultra-low power consumption memory.

In the memristor array 140 illustrated in FIG. 2, a value (logical value 1 or logical value 0) of the vector to be compared with the input vector is written in advance in a plurality of memristors R connected to each of the bit lines B (B0 to Bn). For example, in the vector to be compared, the memristor R corresponding to the bit of the logical value 1 is set to the low-resistance state (on). The memristor R corresponding to the bit of the logical value 0 is set to the high-resistance state (off). Furthermore, the logical value 1 (on) is written in advance in all the memristors R connected to the bit line Bon.

Then, in the detection operation of detecting the nearest-neighbor vector by comparing the input vector with the vector to be compared, the voltage of each of the word lines W (W0 to Wn) is set to a high level or a low level according to the logical value of each bit value of the input vector. In the detection operation, a first read operation and a second read operation are sequentially executed on the memristor array 140.

In the first read operation, in the input vector, the word line W corresponding to the bit of the logical value 1 is set to the high level, and the word line W corresponding to the bit of the logical value 0 is set to the low level. In the second read operation, in the input vector, the word line W corresponding to the bit of the logical value 1 is set to the low level, and the word line W corresponding to the bit of the logical value 0 is set to a high/low level. Furthermore, in the first read operation and the second read operation, the bit lines Bon and B0 to Bn are set to a ground voltage GND.

In a case where the memristor R connected to a high-level word line W is in the low-resistance state (on), a current flows from the word line W to the bit line B. In a case where the memristor R connected to the high-level word line W is in the high-resistance state (off), no current flows from the word line W to the bit line B. In a case where the word line W is set to the low level, no current flows from the word line W to the bit line B regardless of the resistance state of the memristor R.

Then, in the first read operation and the second read operation, a total sum of the currents flowing in the memristors R in the low-resistance state connected to the high-level word line W is detected as the voltage for each of the bit lines Bon and B0 to Bn. Therefore, in the first read operation, in the vector to be compared corresponding to each of the bit lines B0 to B4, the number of coincidences of the bits of the bit value 1 among the bits in the same bit position as that of the bit value 1 of the input vector is detected.

In the second read operation, in the vector to be compared corresponding to each of the bit lines B0 to B4, the number of coincidences of the bits of the bit value 0 among the bits in the same bit position as that of the bit value 0 of the input vector is detected by using a current flowing in the bit line Bon. A way of obtaining the number of coincidences of the bit value 0 of the vector to be compared is described in detail with reference to FIG. 3.

After that, a sum of the number of coincidences of the bit value 1 in the first read operation and the number of coincidences of the bit value 0 in the second read operation is obtained for each vector to be compared. Then, the vector having a maximum sum of the numbers of coincidences is detected as the nearest-neighbor vector.

Figure 3:
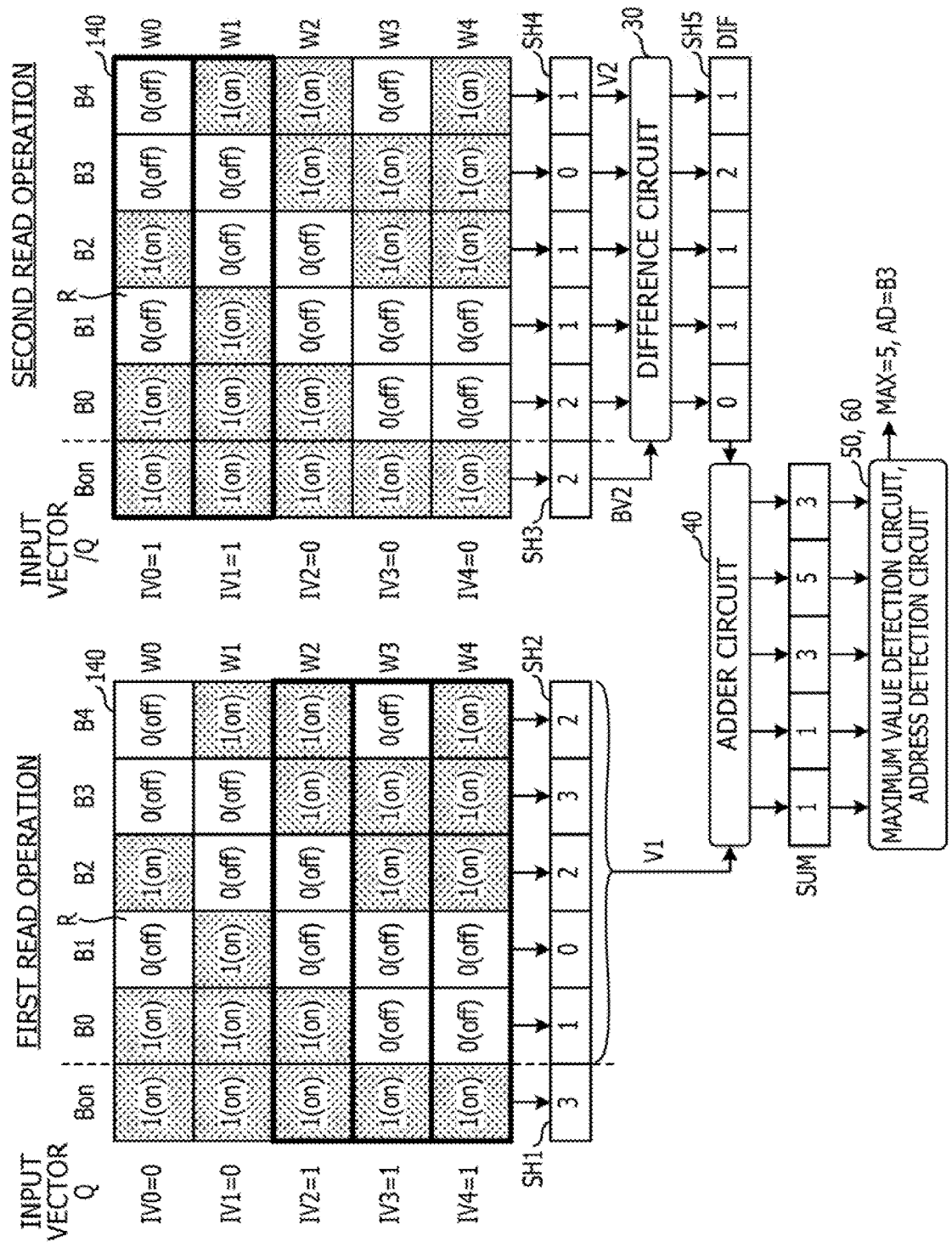
FIG. 3 is an illustrative diagram illustrating an example of a detection operation of detecting a nearest-neighbor vector by the computer in FIG. 1.

FIG. 3 illustrates an example of the detection operation of detecting the nearest-neighbor vector by the computer 100 in FIG. 1. Hereinafter, an example of a calculation method of the computer 100 by the program executed by the CPU 110 is illustrated. The memristor array 140 and the holding units SH1 and SH2 on a left side in FIG. 3 illustrate a state in the first read operation. The memristor array 140 and the holding units SH3, SH4, and SH5 on a right side in FIG. 3 illustrate a state in the second read operation.

For making the description easy to understand, in FIG. 3, the memristor array 140 includes five word lines W0 to W4, the bit line Bon, and five bit lines B0 to B4, and includes 30 memristors R indicated by rectangles. Therefore, the number of bits of an input vector Q and the vector to be compared set in each of the bit lines B0 to B4 is five. The input vector Q supplied to the memristor array 140 at the time of the first read operation is an example of a first pattern.

A shaded memristor R indicates that this is set to the low-resistance state (on, logical value 1). A white memristor R indicates that this is set to the high-resistance state (off, logical value 0). Before the detection operation of the nearest-neighbor vector, data corresponding to the vector to be compared is written in advance in the memristor array 140 for each of the bit lines B0 to B4. Furthermore, all the memristors R connected to the bit line Bon are set in advance to the low-resistance state (on, logical value 1). Therefore, storing states of the memristor array 140 are the same as each other in the first read operation and the second read operation.

The nearest-neighbor vector closest to the input vector Q may be detected by determining the degree of similarity of the bit value of the vector to be compared to the bit value of the input vector Q. The bit value 1 (on) of the input vector Q is indicated by the high level of the word line W. Therefore, in a case where the current flows in the memristor R connected to the high-level word line W, it may be detected that the bit value 1 of the input vector Q and the bit value 1 of the vector to be compared are in the same position. Hereinafter, a fact that the bit value 1 of the input vector Q and the bit value 1 of the vector to be compared are in the same position is also referred to as on-on coincidence. In other words, for example, on-on coincidence indicates that the bit of the vector to be compared corresponding to the bit position of the bit value 1 of the input vector Q has the bit value 1. In the first read operation, on-on coincidence detection is executed.

In contrast, in a case where a level opposite to that of the bit value of the input vector Q is set in the word line W, the number of word lines W set to the high level indicates the number of bit values 0 (off) of the input vector Q. Therefore, by setting the level opposite to that of the bit value of the input vector Q in the word line W and detecting the current flowing in the bit line Bon, it is possible to determine the number of bit values 0 (off) of the input vector Q.

The memristor R connected to the word line W corresponding to the bit value 0 (off) of the input vector Q is in the low-resistance state or the high-resistance state. In other words, for example, the bit value of each vector to be compared corresponding to the bit value 0 (off) of the input vector Q may include both "0 (off)" and "1 (on)". Therefore, the number of bit values 0 (off) of the input vector Q detected by the current flowing in the bit line Bon while setting the level opposite to that of the bit value of the input vector Q in the word line W indicates both off-on coincidence and off-off coincidence.

Off-on coincidence indicates that the bit value 0 of the input vector Q and the bit value 1 of the vector to be compared are in the same position. In other words, for example, off-on coincidence indicates that the bit of the vector to be compared corresponding to the bit position of the bit value 0 of the input vector Q has the bit value 1. Off-off coincidence indicates that the bit value 0 of the input vector Q and the bit value 0 of the vector to be compared are in the same position. In other words, for example, off-off coincidence indicates that the bit of the vector to be compared corresponding to the bit position of the bit value 0 of the input vector Q has the bit value 0.

In the second read operation, a sum of the number of bits of off-on coincidence and the number of bits of off-off coincidence may be obtained on the basis of the current flowing in the bit line Bon in which all the memristors R connected thereto are set in the low-resistance state. Furthermore, the number of bits of off-on coincidence may be obtained on the basis of the current flowing in each of the bit lines B0 to B4. Then, by subtracting the number of bits detected on the basis of the current flowing in each of the bit lines B0 to B4 from the number of bits detected on the basis of the current flowing in the bit line Bon, the number of bits of off-off coincidence (DIF) may be obtained.

After that, the number of bits of on-on coincidence detected in the first read operation is added to the number of bits of off-off coincidence detected in the second read operation for each of the bit lines B0 to B4. Therefore, the sum of the number of bits of on-on coincidence and the number of bits of off-off coincidence may be obtained for each of the bit lines B0 to B4.

In other words, for example, it is possible to obtain similarity information used for determining similarity with the input vector Q for each vector to be compared stored in the memristor R connected to each of the bit lines B0 to B4. Then, the vector to be compared having a maximum sum SUM obtained by the addition may be detected as the nearest-neighbor vector. A detection example of the nearest-neighbor vector is described below.

First, in the first read operation, the driver 130 in FIG. 1 drives the word lines W0 to W4 according to the logical value of each of the bits IV (IV0 to IV4) of the input vector Q. Therefore, the input vector Q is supplied to the memristor array 140 via the word lines W0 to W4. For example, the bit values IV0 to IV4 of the input vector Q are "00111". In the first read operation, the driver 130 sets the word line W corresponding to the bit IV of the logical value 0 to the low level (0 level) and sets the word line W corresponding to the bit IV of the logical value 1 to the high level (1 level).

Therefore, in a region indicated by a bold frame corresponding to the word lines W2 to W4, a current flows in the shaded memristor R in the low-resistance state. The current-voltage conversion circuit 10 in FIG. 1 converts the currents flowing in the bit lines Bon and B0 to B4 via the memristor R into voltages, respectively.

The holding unit SH1 that operates at the time of the first read operation holds the voltage corresponding to the current in the bit line Bon. The holding unit SH2 that operates at the time of the first read operation holds the voltages corresponding to the currents in the bit lines B0 and B4, respectively, and outputs the same as the voltages V1. In FIG. 3, for making the description easy to understand, the voltages held by the holding units SH1 and SH2 are indicated by the number of memristors R in which the current flows (the number of bits of on-on coincidence).

In this example, the holding unit SH1 holds "3" corresponding to the number of three memristors R in the low-resistance state connected to the high-level word line W2 to W4. The holding unit SH2 holds "10232" according to the number of memristors R in the low-resistance state in each of the bit lines B0 to B4 connected to the high-level word lines W2 to W4. In this manner, the number of on-on coincidences between the input vector Q and each vector to be compared may be detected by the first read operation.

In the second read operation, the driver 130 drives the word lines W0 to W4 according to the logical value of each of the bits IV (IV0 to IV4) of an input vector/Q, which is the inverted pattern obtained by inverting the logical value of the input vector Q. Therefore, the word lines W0 and W1 set to the low level at the time of the first read operation are set to the high level at the time of the second read operation. The word lines W2 to W4 set to the high level at the time of the first read operation are set to the low level at the time of the second read operation. The input vector/Q supplied to the memristor array 140 at the time of the second read operation is an example of a second pattern.

Then, in the second read operation, the current flows in the shaded memristor R in the low-resistance state in a region indicated by a bold frame corresponding to the word lines W0 and W1. As in the first read operation, the current flows according to the number of memristors R in which the current flows in each of the bit lines Bon and B0 to B4. The current-voltage conversion circuit 10 converts the currents flowing in the bit lines Bon and B0 to B4 via the memristors R into voltages, respectively.

The holding unit SH3 that operates at the time of the second read operation holds the voltage corresponding to the current in the bit line Bon. In this example, the holding unit SH3 holds "2" corresponding to the number of two memristors R in the low-resistance state connected to the high-level word lines W0 and W1. The holding unit SH4 holds "21101" according to the number of memristors R in the low-resistance state in each of the bit lines B0 to B4 connected to the high-level word lines W0 and W1.

As described above, the voltages held by the holding unit SH3 indicate the sum of the number of bits of off-on coincidence and the number of bits of off-off coincidence. The voltage held by the holding unit SH3 for each of the bit lines B0 to B4 indicates the number of bits of off-on coincidence. The difference circuit 30 detects the number of bits of off-off coincidence by subtracting the voltage held by the holding unit SH3 from the voltages held by the holding unit SH4. The difference circuit 30 holds a difference result (01121) in the holding unit SH5.

The adder circuit 40 adds the voltages V1 for the respective vectors from the holding unit SH2 to the difference voltages DIF for the respective vectors from the holding unit SH5, respectively, to obtain the sum voltages SUM="11353". The sum voltage SUM for each of the bit lines B0 to B4 indicates the sum of the number of bits of on-on coincidence and the number of bits of off-off coincidence. Therefore, it is indicated that the larger the value of the sum voltage SUM for each detection vector, the more similar this is to the input vector Q.

The maximum value detection circuit 50 detects the maximum voltage MAX="5" out of the sum voltages SUM for the respective vectors. The address detection circuit 60 detects the address AD="B3" indicating the position of the memristor array 140 that holds the vector corresponding to the maximum sum voltage SUM. The address AD="B3" indicates the position of the bit line B3.

From above, the computer 100 detects that the nearest-neighbor vector is the vector stored in the memristor R connected to the bit line B3 and the degree of similarity is "5". In this example, the input vector Q and the vector to be compared are of 5 bits, so that the degree of similarity "5" indicates perfect coincidence. Note that, FIG. 3 illustrates an example of detecting the nearest-neighbor vector by executing the first read operation and the second read operation in order. However, the second read operation and the first read operation may be executed in order.

Figure 4:
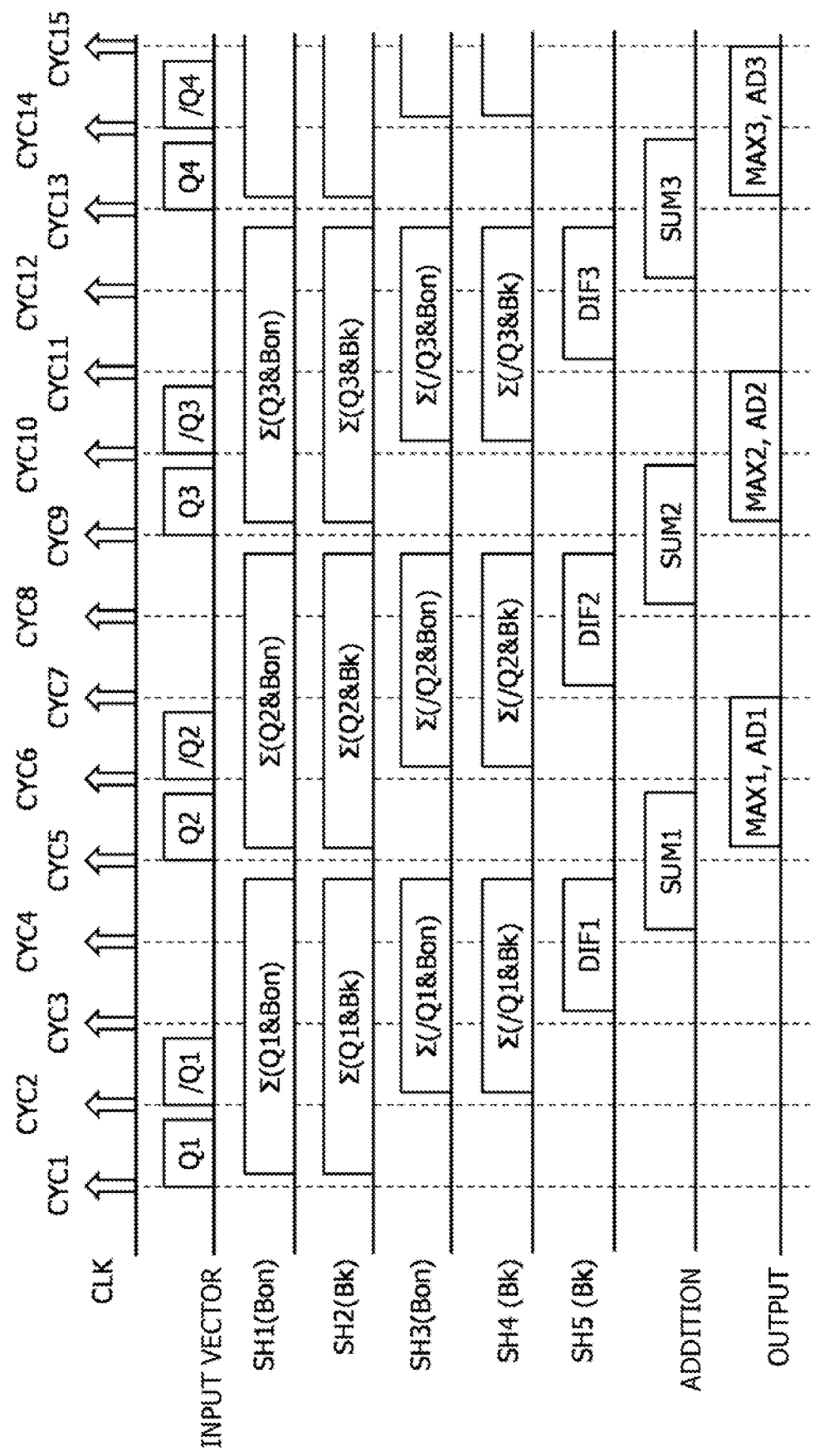
FIG. 4 is a timing chart illustrating an example of an operation of the computer in FIG. 1.

FIG. 4 illustrates an example of the operation of the computer 100 in FIG. 1. In FIG. 4, for making the description easy to understand, the operation based on the current flowing in the bit lines Bon and Bk is illustrated.

In a first clock cycle CYC1, a level corresponding to each bit value of the input vector Q1 is applied to the word line W. Therefore, the total sum of the currents flowing in the memristors R corresponding to the bits of the logical value 1 of the input vector Q1 is held by the holding unit SH1 as the voltage BV1. Furthermore, the total sum of the currents flowing in the memristors R in the low-resistance state of the vector to be compared is held by the holding unit SH2 as the voltage V1 corresponding to the bits of the logical value 1 of the input vector Q1. In other words, for example, the first read operation is executed, and the number of bits of on-on coincidence is obtained.

Next, in a clock cycle CYC2, a level corresponding to the input vector/Q1 obtained by inverting each bit value of the input vector Q1 is applied to the word line W. Therefore, the total sum of the currents flowing in the memristors R corresponding to the bits of the logical value 0 of the input vector Q1 is held by the holding unit SH3 as the voltage BV2. In other words, for example, the sum of the number of bits of off-on coincidence and the number of bits of off-off coincidence is obtained.

Furthermore, the total sum of the currents flowing in the memristors R in the low-resistance state of the vector to be compared is held by the holding unit SH4 as the voltage V2 corresponding to the bits of the logical value 1 of the input vector/Q1 (in other words, for example, the logical value 0 of the input vector Q1). In other words, for example, the second read operation is executed, and the number of bits of off-on coincidence is obtained for each of the bit lines B0 to B4.

Next, in a clock cycle CYC3, the difference voltage DIF between the voltage BV2 held by the holding unit SH3 and the voltage V2 held by the holding unit SH4 is held by the holding unit SH5. In other words, for example, the number of bits of off-off coincidence is obtained for each of the bit lines B0 to B4.

Next, in a clock cycle CYC4, the voltage V1 held by the holding unit SH2 is added to the difference voltage DIF held by the holding unit SH5. In other words, for example, the sum of the number of bits of on-on coincidence and the number of bits of off-off coincidence is obtained for each of the bit lines B0 to B4. At that time, the voltage V1 corresponding to the current flowing in each of the bit lines B0 to B4 detected in the clock cycle CYC1 is held up to the clock cycle CYC4 by the holding unit SH2. Therefore, it is possible to add to the difference voltage DIF held by the holding unit SH5 to the voltage V1 without losing the same.

Next, in a clock cycle CYC5, the maximum voltage MAX of the voltage value for each bit line B held by the holding unit SH5 and the address AD are determined, and the nearest-neighbor vector is detected from the vectors to be compared.

Note that, the computer 100 writes a next vector to be compared in the memristor array 140 by using the clock cycles CYC3 and CYC4. Then, in clock cycles CYC5 to CYC9 and clock cycles CYC9 to CYC10, an operation similar to that in the clock cycles CYC1 to CYC5 described above is executed, and the nearest-neighbor vector is sequentially detected.

Figure 5:
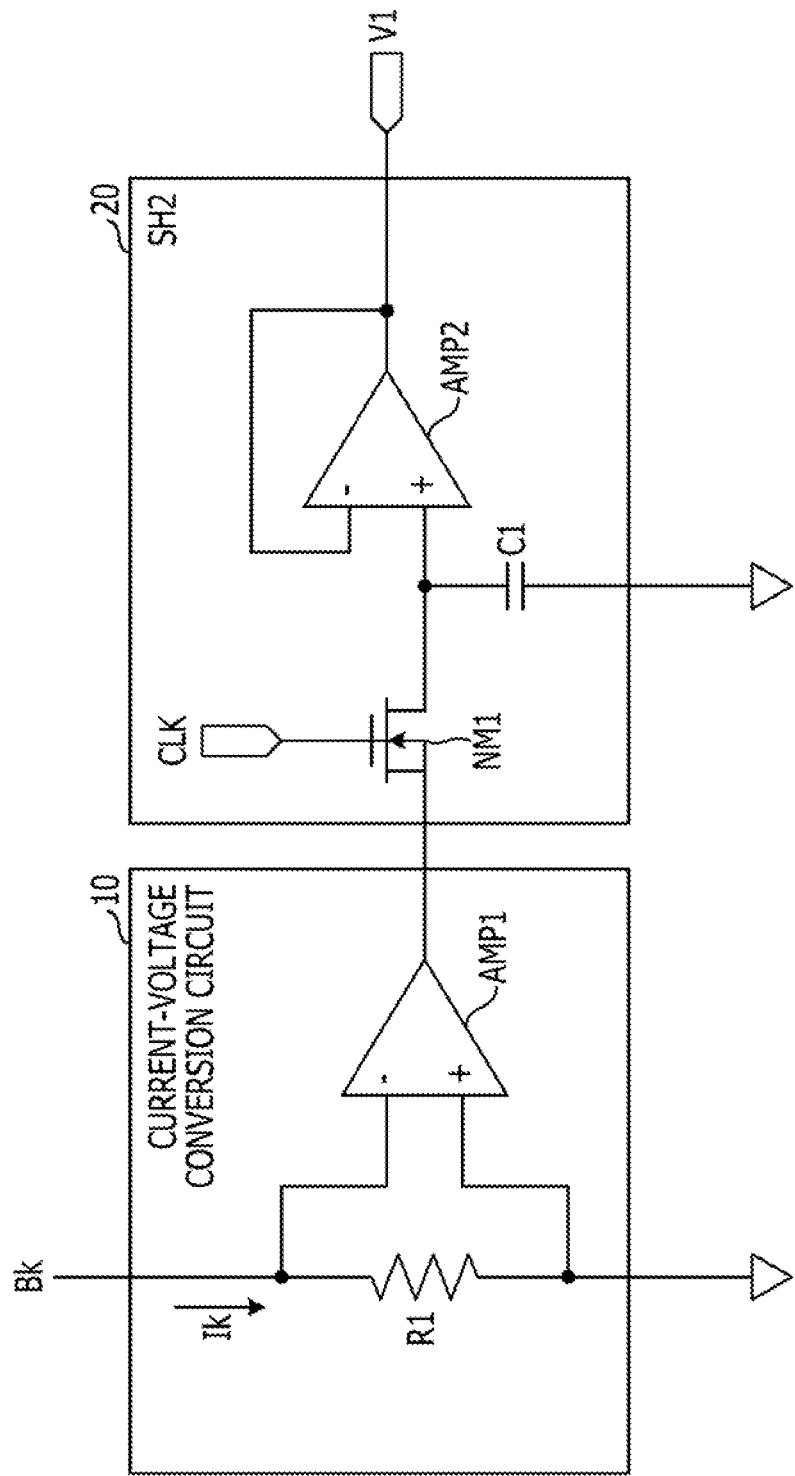
FIG. 5 is a circuit diagram illustrating an example of a current-voltage conversion circuit and a sample and hold circuit in FIG. 1.

FIG. 5 illustrates an example of the current-voltage conversion circuit 10 and the sample and hold circuit 20 in FIG. 1. FIG. 5 illustrates an example in which a current Ik flowing in a bit line Bk is converted into a voltage and held by the holding unit SH2 of the sample and hold circuit 20. However, the current-voltage conversion circuit 10 connected to other bit lines Bon and B, the holding unit SH1, and the holding units SH3 and SH4 of the sample and hold circuit 22 also have a circuit configuration similar to that in FIG. 5. Furthermore, the holding unit SH5 of the sample and hold circuit 24 also has a circuit configuration similar to that in FIG. 5.

The current-voltage conversion circuit 10 includes a resistance element R1 connected to the bit line Bk and an amplifier AMP1. A negative input of the amplifier AMP1 is connected to a bit line Bk side of the resistance element R1, and a positive input of the amplifier AMP1 is connected to a low-voltage line side of the resistance element R1. The current-voltage conversion circuit 10 amplifies a voltage Ik·R1 generated at both ends of the resistance element R1 according to the current Ik by the amplifier AMP1.

Note that, the larger a resistance value of the resistance element R1, the smaller a gain of the amplifier AMP1 may be made, and the stronger against noise. In contrast, the resistance value of the resistance element R1 is set to a value sufficiently smaller than an impedance of a load circuit so as not to affect an operation of the circuit that becomes a load.

The sample and hold circuit 22 includes an n-channel metal oxide semiconductor (MOS) transistor NM1 (switch), a capacitive element C1, and an amplifier AMP2. Hereinafter, the n-channel MOS transistor is simply referred to as a transistor. The transistor NM1 is controlled to be turned on/off by the clock signal CLK, and during an on period, the voltage amplified by the amplifier AMP1 is supplied to a positive input of the sample and hold circuit 20.

The capacitive element C1 is charged according to the voltage received through the transistor NM1 turned on during a high level of the clock signal CLK. The amplifier AMP2 operates as a voltage follower (amplifier with a gain 1). Therefore, the voltage received through the transistor NM1 is directly output from the amplifier AMP2 as the voltage V1. While the clock signal CLK is at a low level and the transistor NM1 is turned off, the capacitive element C1 holds the charged voltage and the amplifier AMP2 maintains the output voltage V1.

Figure 6:
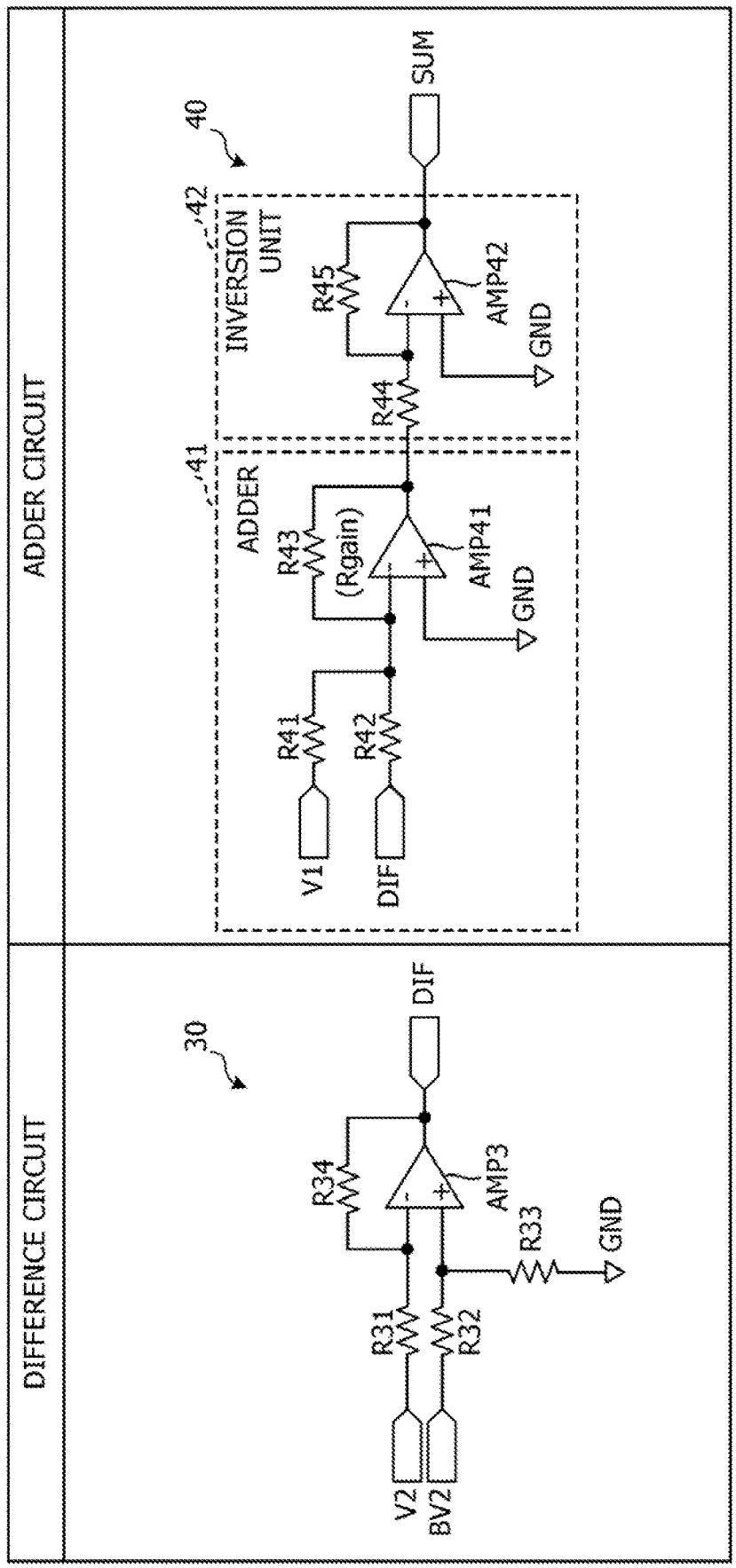
FIG. 6 is a circuit diagram illustrating an example of a difference circuit and an adder circuit in FIG. 1.

FIG. 6 illustrates an example of the difference circuit 30 and the adder circuit 40 in FIG. 1. The difference circuit 30 includes resistance elements R31, R32, R33, and R34 and an amplifier AMP3. The resistance element R31 is connected between a terminal that receives the voltage V2 from the holding unit SH4 and a negative input of the amplifier AMP3. The resistance element R32 is connected between a terminal that receives the voltage BV2 from the holding unit SH3 and a positive input of the amplifier AMP3. The resistance element R33 is connected between the positive input of the amplifier AMP3 and a ground line GND. The resistance element R34 is connected between an output and the negative input of the amplifier AMP3. The difference voltage DIF output by the amplifier AMP3 is set as represented by expression (1) according to the voltage V2 and the voltage BV2.

$$DIF = \frac{R33 \cdot (R31 + R34) \cdot BV2}{R31 \cdot (R32 + R33)} - \frac{R34 \cdot V2}{R31} \quad (1)$$

Here, when all the resistance values of the resistance elements R31, R32, R33, and R34 are made the same, the difference voltage DIF becomes BV2-V2, and a simple difference voltage DIF may be obtained.

The adder circuit 40 includes an adder 41 and an inversion unit 42. The adder 41 includes resistance elements R41, R42, and R43 and an amplifier AMP41. The inversion unit 42 includes resistance elements R44 and R45 and an amplifier AMP42. The resistance element R41 is connected between a terminal that receives the voltage V1 from the holding unit SH2 and a negative input of the amplifier AMP41. The resistance element R42 is connected between a terminal that receives the difference voltage DIF from the holding unit SH5 and the negative input of the amplifier AMP41. The resistance element R43 is connected between an output and the negative input of the amplifier AMP41. A positive terminal of the amplifier AMP41 is connected to the ground line GND.

The resistance element R44 is connected between the output of the amplifier AMP41 and a negative input of the amplifier AMP42. The resistance element R45 is connected between thane output and the negative input of the amplifier AMP42. A positive terminal of the amplifier AMP42 is connected to the ground line GND. In the adder circuit 40 in FIG. 6, since the adder 41 operates as an inverting amplifier, the inversion unit 42 is connected to an output of the adder 41. Note that, in a case where an inversion circuit is included in a subsequent stage of the adder 41, the inversion unit 42 is omitted.

The sum voltage SUM output by the adder circuit 40 is set as represented by expression (2) according to the voltage V1 and the difference voltage DIF. As represented by expression (2), the adder circuit 40 may execute addition with a gain Rgain.

$$SUM = Rgain \cdot \left(\frac{V1}{R41} + \frac{DIF}{R42}\right) \quad (2)$$

Figure 7:
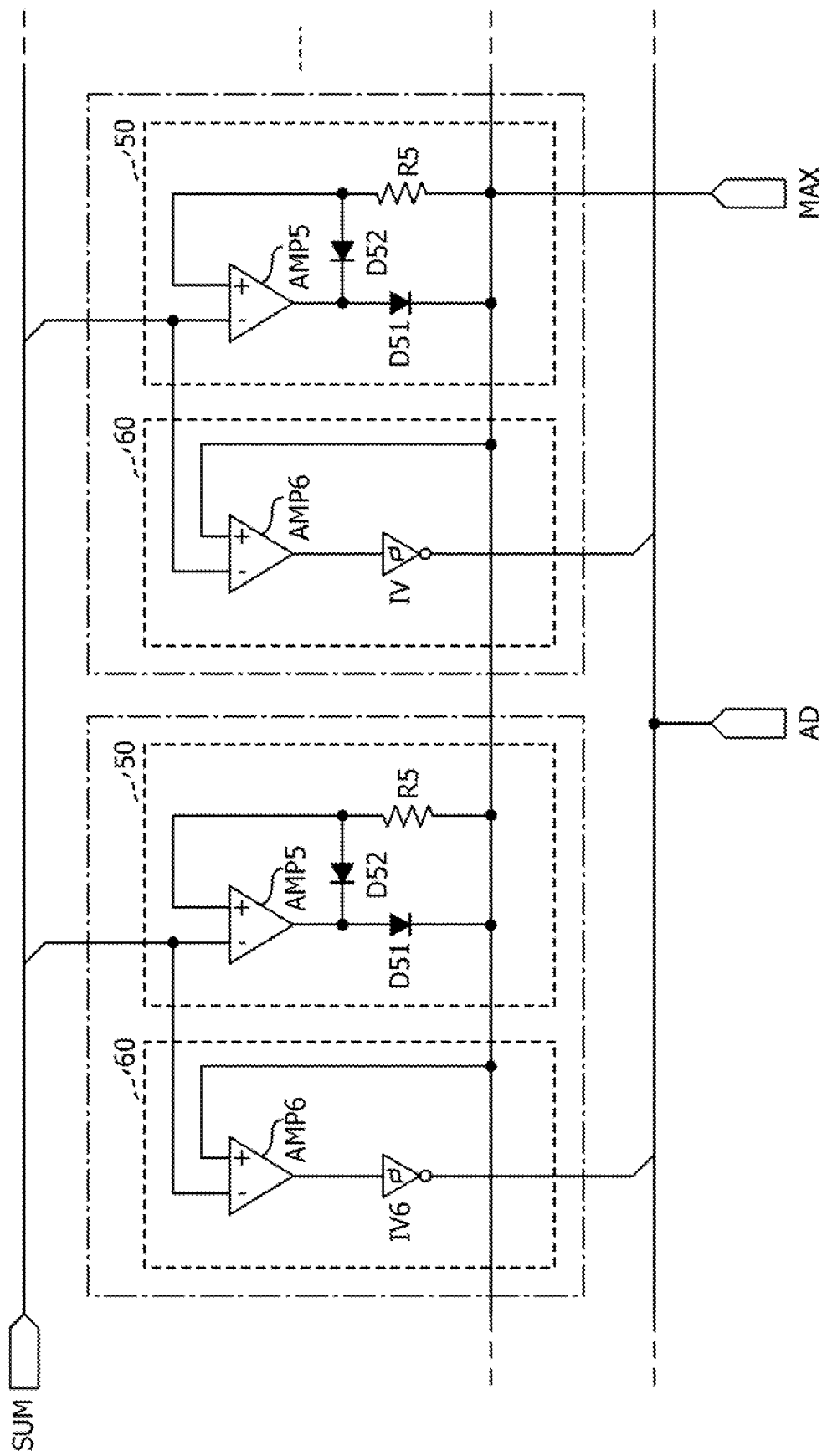
FIG. 7 is a circuit diagram illustrating an example of a maximum value detection circuit and an address detection circuit in FIG. 1.

FIG. 7 illustrates an example of the maximum value detection circuit 50 and the address detection circuit 60 in FIG. 1. The maximum value detection circuit 50 and the address detection circuit 60 are provided for each sum voltage SUM corresponding to each of the bit lines B0 to B4 in FIG. 2. The number of signal lines SUM that transmit the sum voltage SUM is equal to the number of bit lines B0 to Bn of the memristor array 140.

The maximum value detection circuit 50 includes an amplifier AMPS, diodes D51 and D52, and a resistance element R5. A negative input of the amplifier AMPS is connected to the signal line SUM, and a positive input of the amplifier AMPS is connected to an anode of the diode D52. A cathode of the diode D52 is connected to an output of the amplifier AMPS and an anode of the diode D51. A cathode of the diode D51 is connected to a signal line MAX that outputs the maximum voltage MAX. The resistance element R5 is connected between the positive input of the amplifier AMPS and the signal line MAX. The signal line MAX is commonly wired to all the maximum value detection circuits 50 and all the address detection circuits 60.

The address detection circuit 60 includes an amplifier AMP6 and a Schmitt trigger type inverter IV6. A negative input of the amplifier AMP6 is connected to the signal line SUM, and a positive input of the amplifier AMP6 is connected to the signal line MAX. A Schmitt trigger threshold is set to a sufficiently small value close to zero. Therefore, the inverter IV6 outputs a high level (logical 1) when values input to the positive input and negative input of the amplifier AMP6 are sufficiently close to each other. An output of the amplifier AMP6 is connected to an address line AD that transmits the address AD via the inverter IV6. The address line AD is wired corresponding to each of the bit lines B0 to Bn in FIG. 2.

The maximum sum voltage SUM is output as the maximum voltage MAX to a common output (MAX) of a plurality of maximum value detection circuits 50 that receives the sum voltages SUM for the respective bit lines B0 to Bn, respectively. The address detection circuit 60 that receives the sum voltage SUM lower than the maximum voltage MAX outputs the logical value 0 as the address AD. The address detection circuit 60 that receives the sum voltage SUM of the maximum voltage MAX outputs the logical value 1 as the address AD. In other words, for example, the address detection circuit 60 sets the address line AD corresponding to the bit line B corresponding to the maximum voltage MAX to the logical value 1, and sets the address line AD corresponding to other bit lines B to the logical value 0. Therefore, the CPU 110 in FIG. 1 may determine the vector stored in the memristor R connected to the bit line B corresponding to the address AD of the logical value 1 as the nearest-neighbor vector.

Note that, i a case where there is a plurality of maximum sum voltages SUM, all the addresses AD corresponding to the maximum sum voltage SUM are set to the logical value 1. In this case, the CPU 110 may determine, for example, the vector stored in the memristor R connected to the bit line B having the smallest number among the bit lines B corresponding to the addresses AD having the logical value 1 as the nearest-neighbor vector. Alternatively, the CPU 110 may determine a plurality of vectors stored in the memristors R connected to a plurality of bit lines B corresponding to a plurality of addresses AD as the nearest-neighbor vectors.

As described above, in this embodiment, the nearest-neighbor vector may be detected by using one memristor array 140. Therefore, a circuit scale of the computer 100 including the memristor array 140 used for detecting the nearest-neighbor vector may be reduced.

Figure 8:
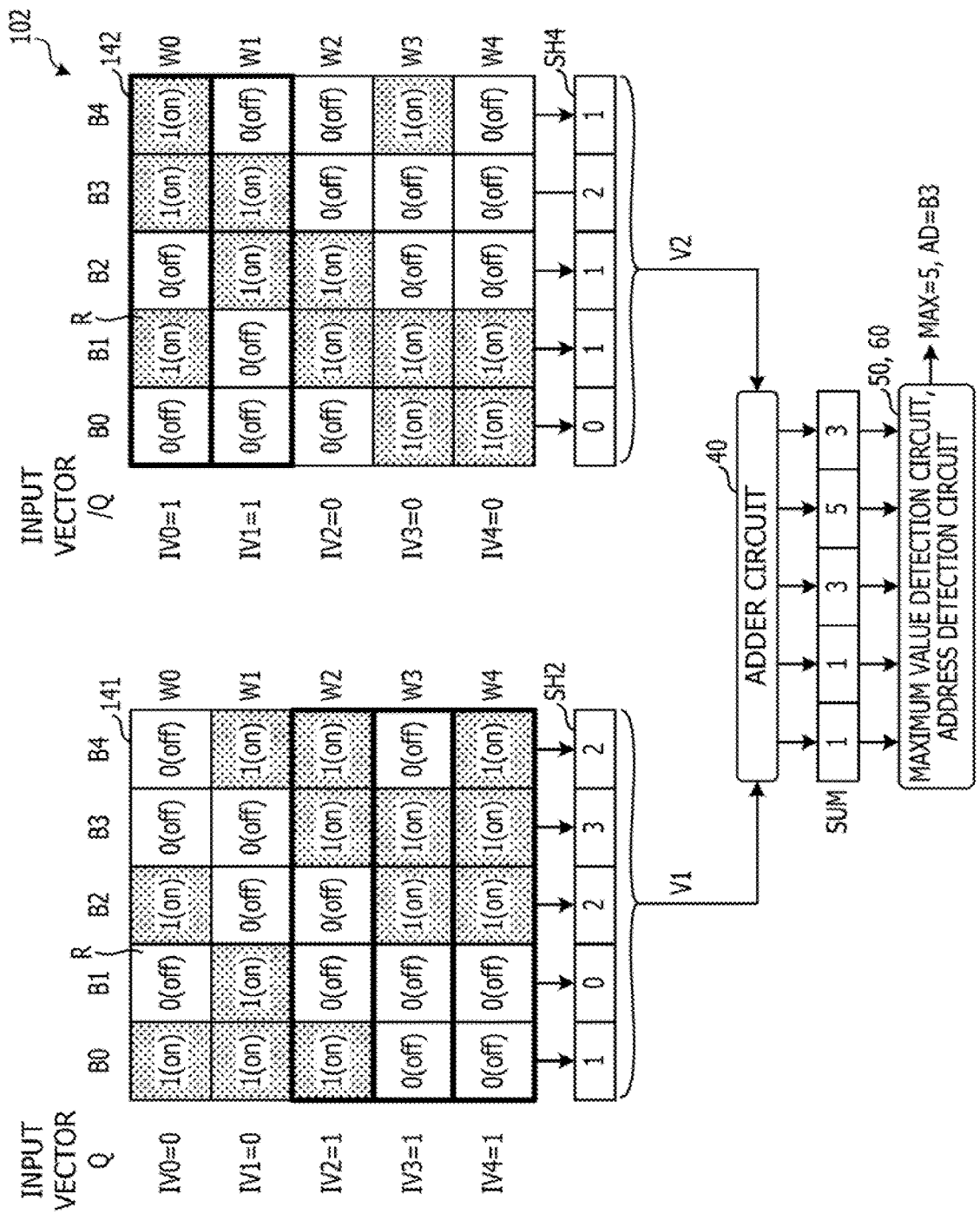
FIG. 8 is an illustrative diagram illustrating an example of a detection operation of detecting a nearest-neighbor vector by another computer.

FIG. 8 illustrates an example of a detection operation of detecting the nearest-neighbor vector by another computer. Elements similar to those in FIG. 3 are denoted by the same reference signs, and detailed description is omitted. A computer 102 illustrated in FIG. 8 includes two memristor arrays 141 and 142 corresponding to the memristor array 140 in FIG. 1.

However, the memristor arrays 141 and 142 do not include the bit line Bon, the memristor R connected to the bit line Bon, and the holding units SH1 and SH3. The holding unit SH2 is provided corresponding to the memristor array 141. The holding unit SH4 is provided corresponding to the memristor array 142. The computer 102 does not include the difference circuit 30 and the sample and hold circuit 24 (holding unit SH5) in FIG. 3.

The memristor array 141 stores the same plurality of vectors as the memristor array 140. The memristor array 142 stores a vector obtained by inverting the bit value of the vector stored in the memristor array 141. An operation of the memristor array 141 is similar to the first read operation in FIG. 3 except that there is no bit line Bon. In other words, for example, the computer 102 uses the memristor array 141 to detect the number of bits of on-on coincidence.

The word line W of the memristor array 142 is set to a level corresponding to the bit value of the input vector/Q obtained by inverting the bit value of the input vector Q. As described above, the memristor array 142 stores the vector obtained by inverting the bit value. Therefore, the computer 102 may detect the number of bits of off-off coincidence by using the memristor array 141. The adder circuit 40 adds the voltage V1 held by the holding unit SH2 to the voltage V2 held by the holding unit SH4 for each bit line B. Another operation is similar to that in FIG. 3.

In the computer 102 illustrated in FIG. 8, a total size of the memristor arrays 141 and 142 is almost twice the size of the memristor array 140 in FIG. 3. Therefore, for example, in a case where the computer 102 is configured by one chip, it becomes difficult to increase capacities of the memristor arrays 141 and 142. In other words, for example, the size of the vector that may be compared by one chip becomes smaller than that of the computer 100 in FIG. 1, or the number of stored vectors to be compared is reduced.

Figure 9:
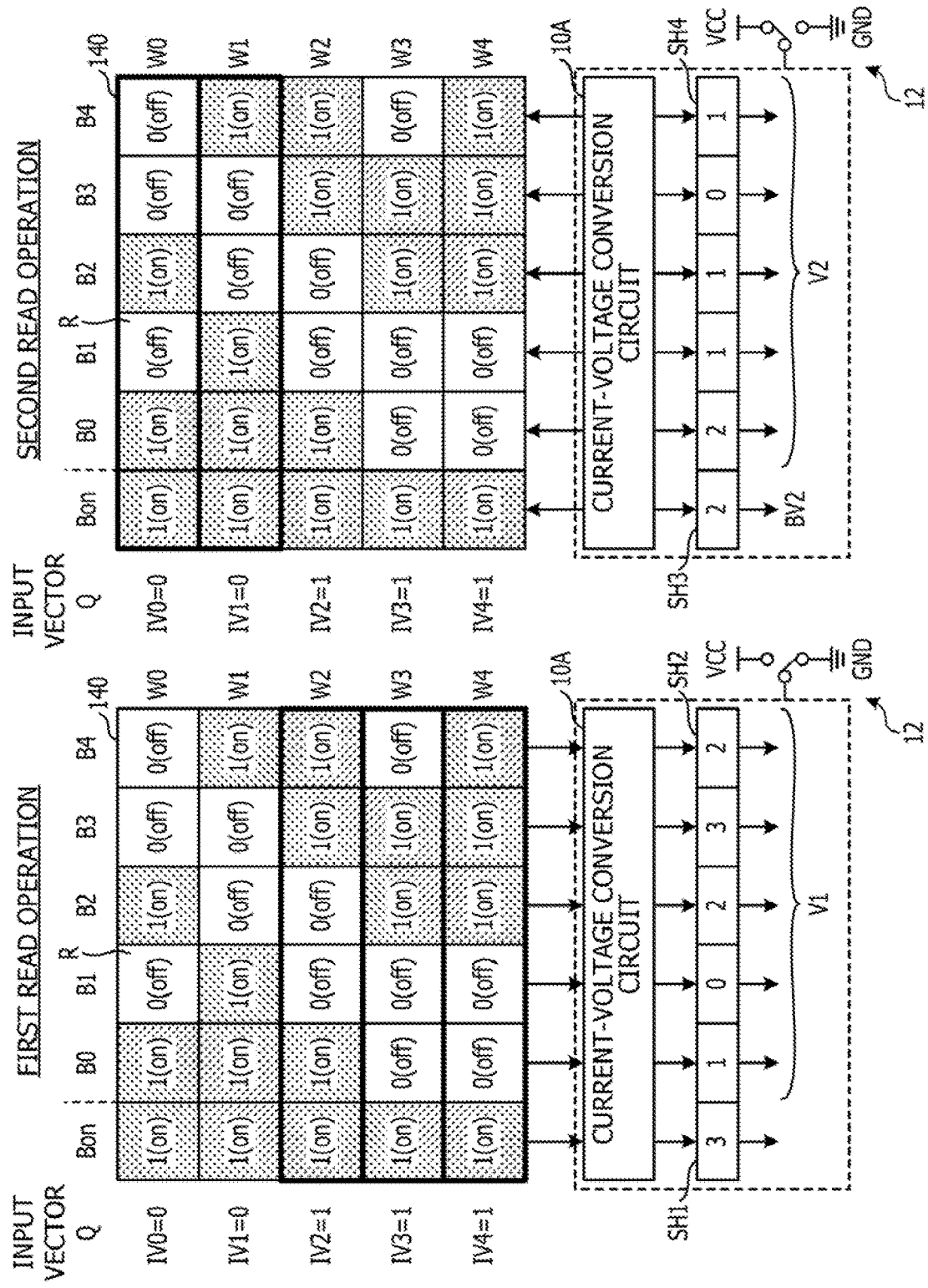
FIG. 9 is an illustrative diagram illustrating an example of a detection operation of detecting a nearest-neighbor vector by a computer according to another embodiment.

FIG. 9 illustrates an example of a detection operation of detecting a nearest-neighbor vector by a computer according to another embodiment. Elements similar to those in the above-described embodiment are denoted by the same reference signs, and detailed description is omitted. Furthermore, as for an operation similar to that in the above-described embodiment, detailed description is omitted. For making the description easy to understand, it is assumed that a memristor array 140 includes five word lines W0 to W4, a bit line Bon, and five bit lines B0 to B4 as in FIG. 3.

A computer 100A illustrated in FIG. 9 includes a current-voltage conversion circuit 10A instead of the current-voltage conversion circuit 10 in FIG. 1. Furthermore, the computer 100A includes a changeover switch 12 that switches a bias voltage of a ground line of peripheral circuits from the current-voltage conversion circuit 10A to a detection result output circuit 70 (FIG. 1) to a ground voltage GND or a power supply voltage VCC. Other configurations of the computer 100A are similar to those of the computer 100 in FIG. 1.

A ground line of a driver 130 (FIG. 1) is constantly connected to a ground line GND. The driver 130 sets a voltage level of each of the word lines W0 to W4 to a level corresponding to a bit value of an input vector Q in a first read operation and a second read operation. The changeover switch 12 connects the ground line of the peripheral circuit to the ground line GND during the first read operation and connect the same to a power supply line VCC during the second read operation. For example, switching of the changeover switch 12 is controlled by a CPU 110 (FIG. 1).

Therefore, in the first read operation, as in FIG. 3, a current flows from the word line W to the current-voltage conversion circuit 10A via a memristor R in a low-resistance state connected to a high-level word line W and the bit line B. In the second read operation, the current flows from the current-voltage conversion circuit 10A to the word line W via the bit line B and the memristor R in the low-resistance state connected to a low-level word line W. Therefore, as described above, the driver 130 may execute the second read operation without inverting a logical value of the input vector Q.

Figure 10:
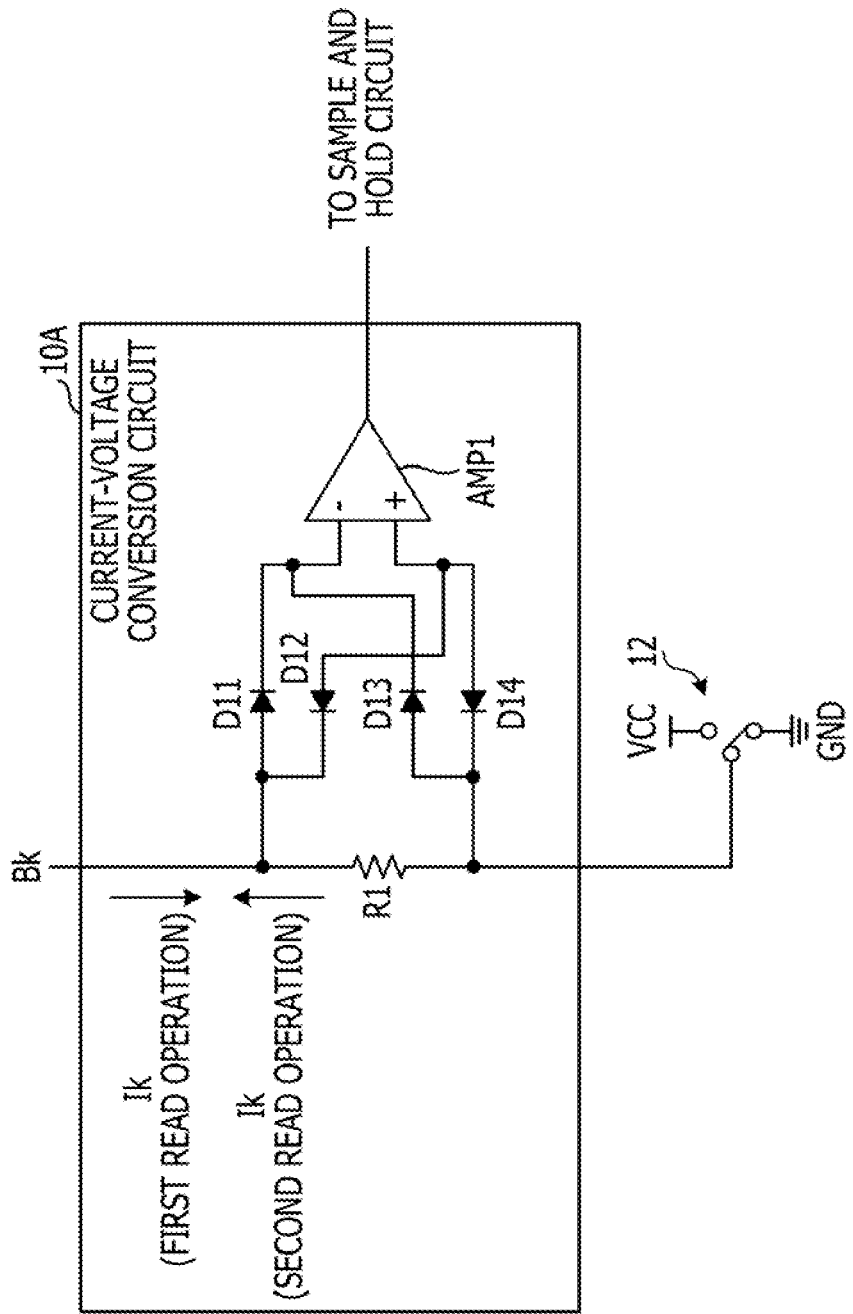
FIG. 10 is a circuit diagram illustrating an example of a current-voltage conversion circuit in FIG. 9.

FIG. 10 illustrates an example of the current-voltage conversion circuit 10A in FIG. 9. FIG. 10 illustrates a circuit connected to a bit line Bk out of the current-voltage conversion circuit 10A. Circuits connected to other bit lines Bon and B are the same as that in FIG. 10. The changeover switch 12 connects a resistance element R1 of the current-voltage conversion circuit 10A to the ground line GND during the first read operation, and connects the resistance element R1 to the power supply line VCC during the second read operation. Therefore, the power supply voltage VCC (bias voltage) is supplied to a ground terminal of the current-voltage conversion circuit 10A during the second read operation.

In the current-voltage conversion circuit 10A, diodes D11, D12, D13, and D14 are added to the current-voltage conversion circuit 10 in FIG. 5. In the diode D11, an anode is connected to the bit line Bk and a cathode is connected to a negative input of an amplifier AMP1. In the diode D12, an anode is connected to a positive input of the amplifier AMP1 and a cathode is connected to the bit line Bk.

In the diode D13, an anode is connected to the changeover switch 12 and a cathode is connected to the negative input of the amplifier AMP1. In the diode D14, an anode is connected to the positive input of the amplifier AMP1 and a cathode is connected to the changeover switch 12. By adding the diodes D11 to D14, it is possible to allow the current-voltage conversion circuit 10A to operate as an absolute value circuit even in a case where the ground terminal of the current-voltage conversion circuit 10A is connected to the ground line GND or the power supply line VCC via the changeover switch 12.

As described above, in this embodiment also, as in the above-described embodiment, it is possible to detect the nearest-neighbor vector by using one memristor array 140, and reduce a circuit scale of the computer 100A. Moreover, in this embodiment, the changeover switch 12 that switches the voltage supplied to the ground terminal of the current-voltage conversion circuit 10A and the like is provided, and the current-voltage conversion circuit 10A operates as the absolute value circuit. Therefore, the driver 130 may set the voltage level of each of the word lines W0 to W4 to the level corresponding to the bit value of the input vector Q in both the first read operation and the second read operation. As a result, control of the driver 130 by the CPU 110 may be simplified. For example, the CPU 110 may instruct the driver 130 to output the same input vector Q in a two-cycle period (first read operation and second read operation) illustrated in FIG. 4. Since a switching frequency of the voltage level of the word line W by the driver 130 may be reduced, a power consumption of the computer 100A may be reduced. An effect of reducing the power consumption is greater as the memristor array 140 is larger, in other words, for example, as the word line W is longer and the number of word lines W is larger.

Figure 11:
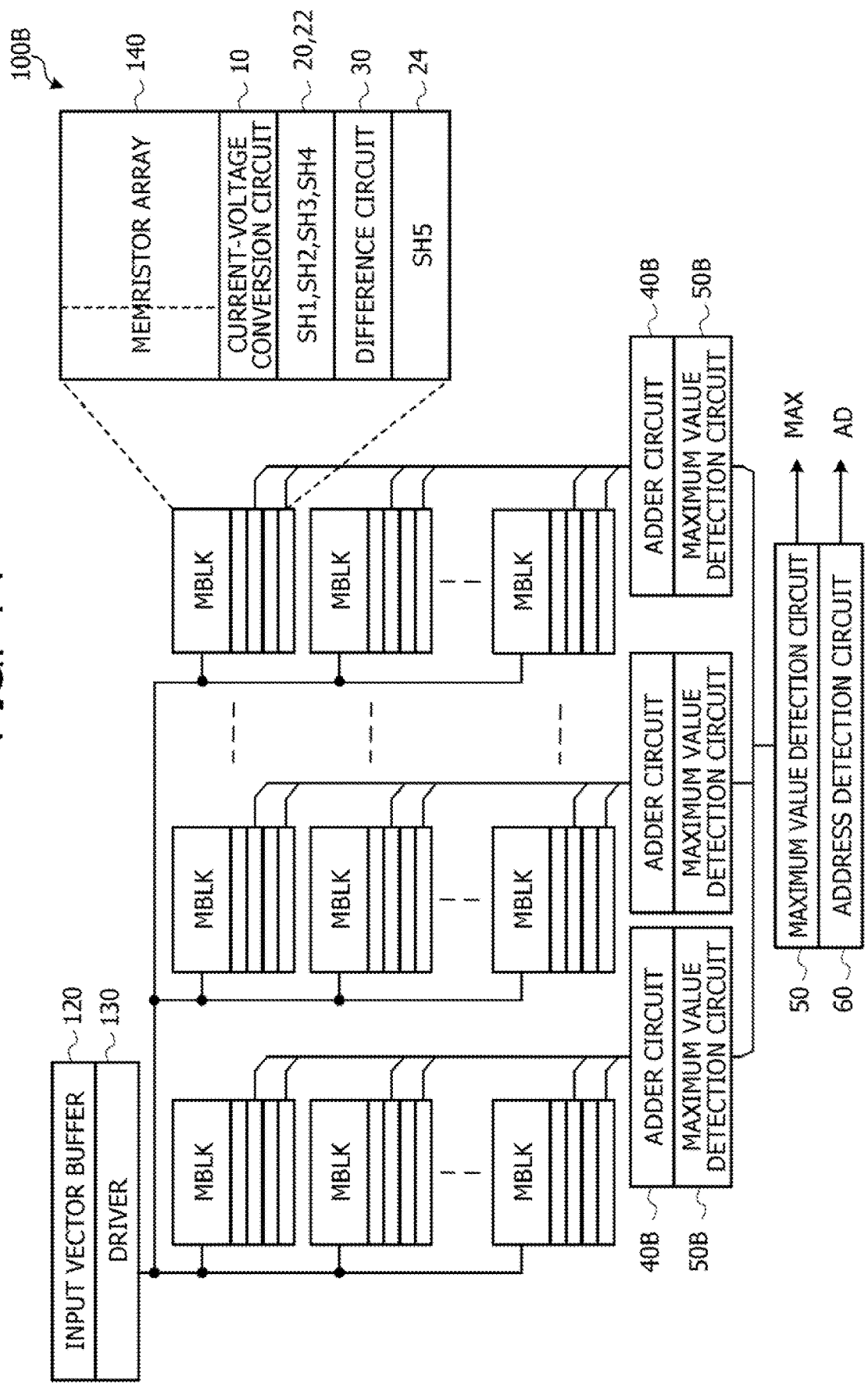
FIG. 11 is a block diagram illustrating an example of a computer according to another embodiment.

FIG. 11 illustrates an example of a computer according to another embodiment. Elements similar to those in the above-described embodiment are denoted by the same reference signs, and detailed description is omitted. Furthermore, as for an operation similar to that in the above-described embodiment, detailed description is omitted.

A computer 100B illustrated in FIG. 11 includes a plurality of memory blocks MBLK including a memristor array 140, a current-voltage conversion circuit 10, sample and hold circuits 20 and 22 (holding units SH1-SH4), a difference circuit 30, and a sample and hold circuit 24 (holding unit SH5). Furthermore, the computer 100B includes an input vector buffer 120, a driver 130, a plurality of adder circuits 40B, a plurality of maximum value detection circuits 50B, a maximum value detection circuit 50, and an address detection circuit 60. In FIG. 11, the maximum value detection circuit 50B is an example of a first maximum value detection circuit, and the maximum value detection circuit 50 is an example of a second maximum value detection circuit. Note that, although not illustrated, the computer 100B includes a CPU 110, a clock generation circuit 150, and a detection result output circuit, as in FIG. 1.

For example, elements illustrated in FIG. 11 may be included in one chip or may be included in a plurality of chips. Moreover, the elements illustrated in FIG. 11 may be included in a plurality of boards on which a plurality of chips is mounted. In a case where the elements illustrated in FIG. 11 are formed of a plurality of chips, each memory block MBLK may transmit a voltage signal (voltage V1 and difference voltage DIF in FIG. 1) as digital data to the adder circuit 40B.

FIG. 11 illustrates an example in which the memory blocks MBLK are arranged in a matrix, but does not illustrate a physical layout. FIG. 11 illustrates that a plurality of memristor arrays 140 is logically two-dimensionally arranged. For example, in a case where the computer 100B is formed of one chip, a plurality of memristor arrays 140 may be stacked by using a plurality of wiring layers. In this case, it is preferable that the memristor arrays 140 of the memory blocks MBLK arranged in a longitudinal direction (first direction) in FIG. 11 are stacked.

In this embodiment, a vector to be compared is stored in a memristor R connected to each of bit lines B0 to Bn (FIG. 2) of a plurality of memory blocks arranged in the longitudinal direction in FIG. 11. For example, in a case where four memory blocks MBLK are arrayed in the longitudinal direction in FIG. 11, the number of bits of the vector to be compared may be made four times that of the computer 100 in FIG. 1. Furthermore, for example, in a case where six memory blocks MBLK are arrayed in a lateral direction in FIG. 11, the number of bits of the vector to be compared may be made six times that of the computer 100 in FIG. 1.

For example, in a case where a plurality of memristor arrays 140 illustrated in FIG. 11 is formed as one memristor array, lengths of the word line W and the bit line B (FIG. 2) become long. In this case, in the word line W, a voltage waveform becomes dull due to a load capacitance and the like, and there is a case where a desired voltage is not obtained on a side farther from the driver 130 (FIG. 1). Furthermore, in the bit line B, a current flowing in the bit line B decreases due to wiring resistance and the like. By combining a plurality of memristor arrays 140, the above-described problem in an operation of the memristor array 140 may be solved.

Each adder circuit 40B that receives a first voltage V1 and a difference voltage DIF not illustrated has a circuit configuration similar to that of the adder circuit 40 in FIG. 6. However, an adder 41 of the adder circuit 40B includes input terminals as many as received voltages V1 and difference voltages DIF, and a resistance element arranged between the input terminal and a negative input of an amplifier AMP41. Each adder circuit 40B receives n+1 voltages V1 and n+1 difference voltages DIF from the holding units SH2 and SH5 of the memory blocks MBLK arranged in the longitudinal direction in FIG. 11. Each adder circuit 40B outputs sum voltages SUM obtained by adding a plurality of voltages V1 to a plurality of difference voltages DIF, for the respective bit lines B to the maximum value detection circuit 50B. Here, the number of voltages V1 and the number of difference voltages DIF received by the adder circuit 40B for each bit line B are equal to the number of memory blocks MBLK arranged in the longitudinal direction.

Each maximum value detection circuit 50B has a circuit configuration similar to that of the maximum value detection circuit 50 in FIG. 7. The maximum value detection circuit 50B detects a candidate for a maximum voltage MAX among the sum voltages SUM from the adder circuit 40B for each of the memory blocks MBLK arranged in the longitudinal direction, and output the detected maximum voltage MAX (candidate) to the maximum value detection circuit 50. Then, the maximum value detection circuit 50 detects the maximum voltage MAX from a plurality of maximum voltages MAX (candidates) received from the maximum value detection circuit 50B. The address detection circuit 60 sets an address line AD corresponding to the maximum voltage MAX to a logical value 1, and sets other address lines AD to a logical value 0. Here, the address line AD indicates a position of the bit line B of the memory block MBLK arrayed in a lateral direction in FIG. 11, and indicates a storage position of the vector to be compared.

As described above, in this embodiment also, as in the above-described embodiment, it is possible to detect a nearest-neighbor vector by using the memristor array 140. Moreover, in this embodiment, by connecting a plurality of memristor arrays 140 in a matrix, it is possible to increase the number of bits of the vector to be compared as compared with a case where a single memristor array 140 is used, and increase the number of vectors to be compared. As a result, detection efficiency of the nearest-neighbor vector may be improved as compared with a case of using the single memristor array 140.

Figure 12:
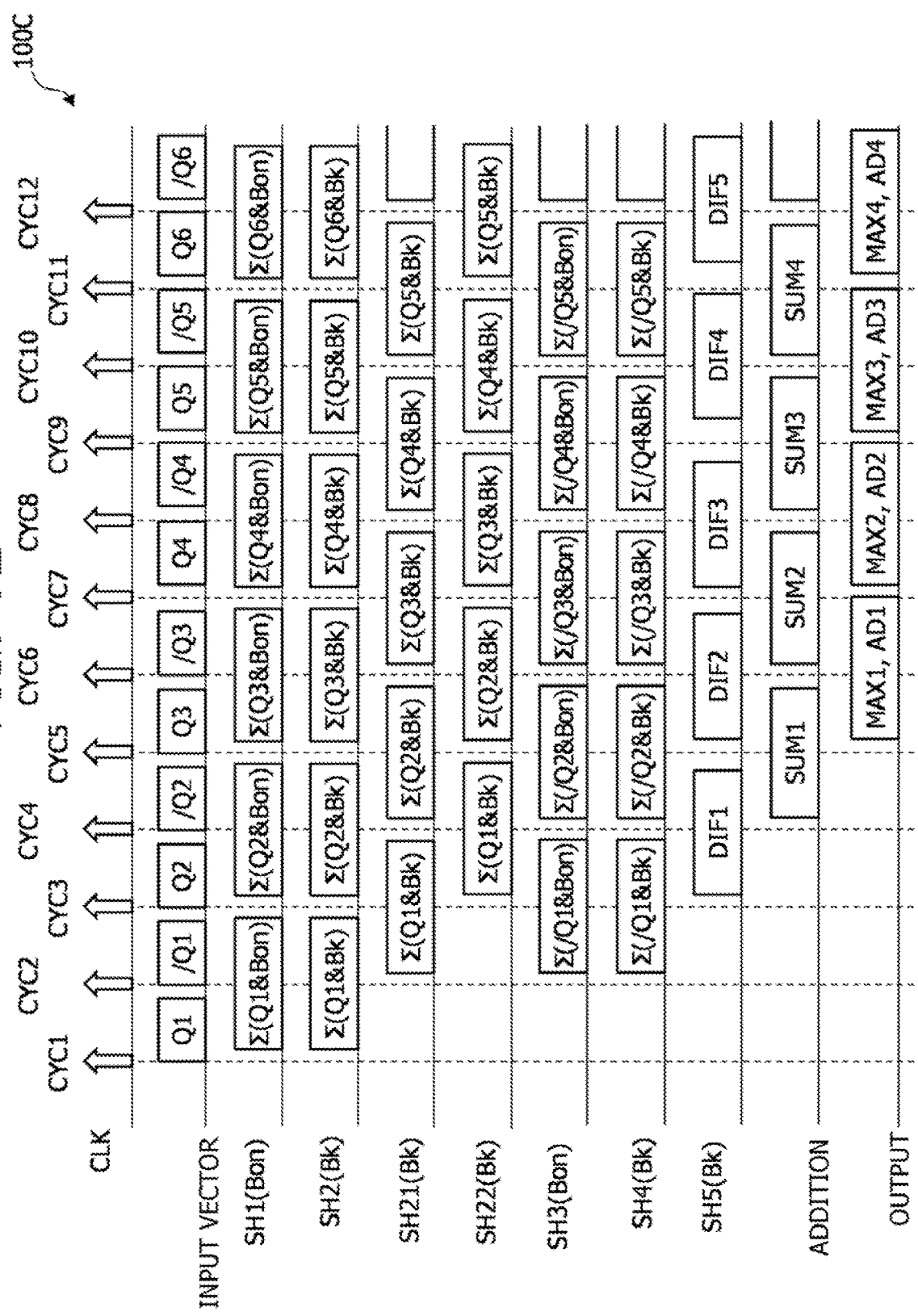
FIG. 12 is a timing chart illustrating an example of a detection operation of detecting a nearest-neighbor vector by a computer according to another embodiment.

FIG. 12 illustrates an example of a detection operation of detecting a nearest-neighbor vector by a computer according to another embodiment. Elements similar to those in the above-described embodiment are denoted by the same reference signs, and detailed description is omitted. Furthermore, as for an operation similar to that in the above-described embodiment, detailed description is omitted.

A computer 100C that executes the detection operation illustrated in FIG. 12 includes holding units SH21 and SH22 connected in series between the holding unit SH2 of the sample and hold circuit 20 and the adder circuit 40 in FIG. 1. The holding units SH21 and SH22 are an example of a fourth holding circuit. Other configurations of the computer 100C are similar to those of the computer 100C in FIG. 1 except that a clock generation circuit 150 generates clock signals CLK that allows the holding units SH21 and SH22 to operate.

By providing the holding units SH21 and SH22, the holding unit SH2 does not have to hold a voltage V1 until a timing at which the holding unit SH5 outputs a difference voltage DIF to the adder circuit 40. Therefore, it is possible to execute a pipeline operation to start next first read operation and second read operation before completion of the detection operation that detects the nearest-neighbor vector on the basis of the first read operation and the second read operation.

In FIG. 12 also, as in FIG. 4, an operation based on currents flowing in bit lines Bon and B0 is illustrated. In this embodiment, input vectors Q and/Q are sequentially supplied to a memristor array 140 without an idle clock cycle CYC. In a next clock cycle CYC after the holding unit SH2 holds a total sum of currents as the voltage V1, the holding unit SH21 holds the voltage V1 output from the holding unit SH2. The holding unit SH22 in a final stage holds the voltage V1 output from the holding unit SH21 in a next clock cycle CYC after the holding unit SH21 holds the voltage V1. The holding unit SH22 outputs the held voltage V1 to the adder circuit 40.

The adder circuit 40 adds the voltage V1 held by the holding unit SH22 to a difference voltage DIF held by the holding unit SH5 in a next clock cycle after the holding unit SH22 holds the voltage V1. Then, a maximum voltage MAX is detected by the maximum value detection circuit 50, and an address AD of a bit line B connected to a memristor R that stores the nearest-neighbor vector is detected by the address detection circuit 60.

As described above, in this embodiment also, as in the above-described embodiment, it is possible to detect the nearest-neighbor vector by using one memristor array 140, and reduce a circuit scale of the computer 100C. Moreover, in this embodiment, the pipeline operation may be executed by providing the holding units SH21 and SH22. As a result, it is possible to continuously execute the first read operation and the second read operation without an idle clock cycle CYC, and a detection frequency of the nearest-neighbor vector may be increased as compared with that in the operation in FIG. 4.

Figure 13:
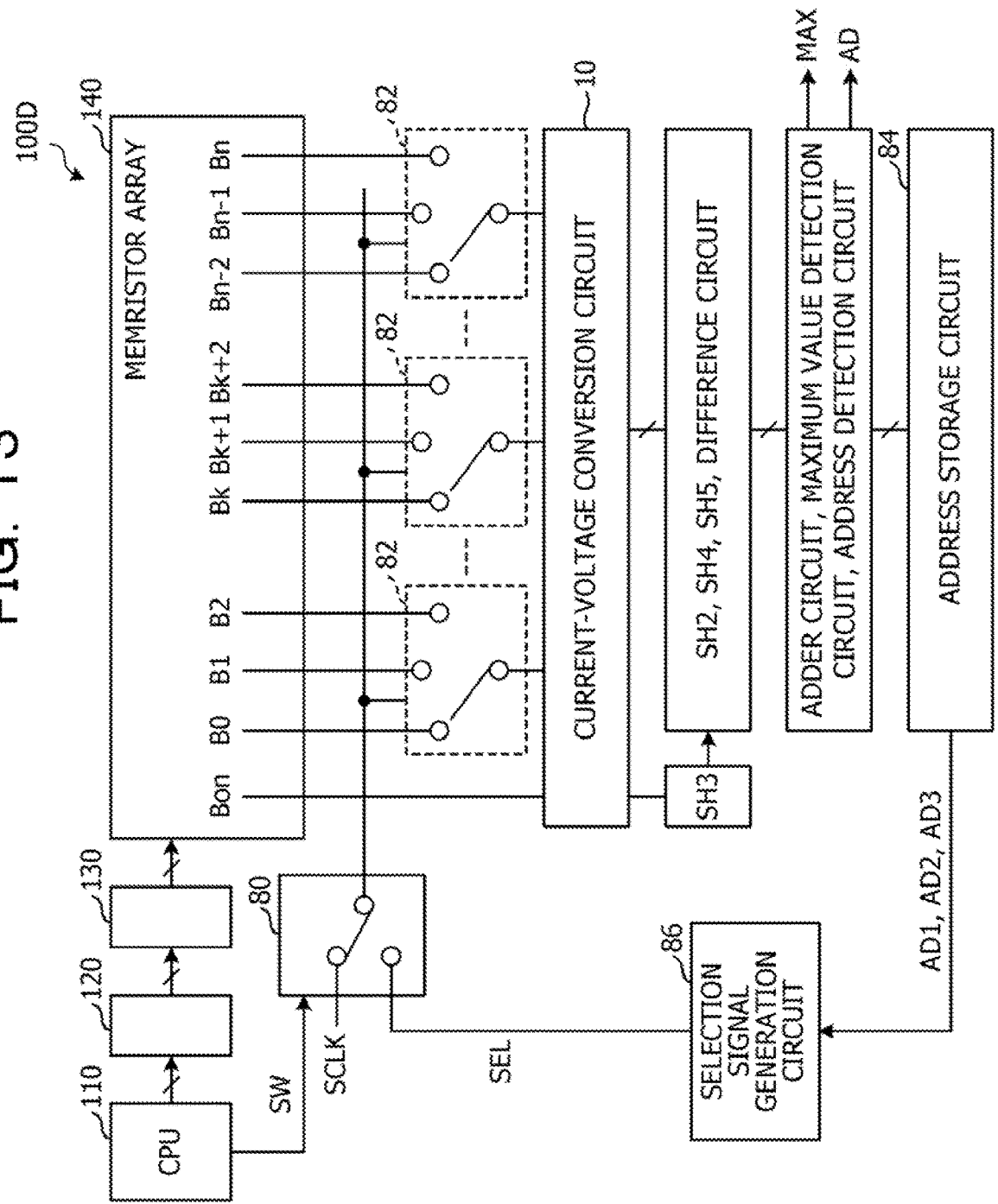
FIG. 13 is a circuit diagram illustrating an example of a substantial part of a computer according to another embodiment.

FIG. 13 illustrates an example of a substantial part of a computer according to another embodiment. Elements similar to those in the above-described embodiment are denoted by the same reference signs, and detailed description is omitted. Furthermore, as for an operation similar to that in the above-described embodiment, detailed description is omitted.

A computer 100D illustrated in FIG. 13 is obtained by adding a changeover switch 80, a plurality of selectors 82, an address storage circuit 84, and a selection signal generation circuit 86 to the computer 100 illustrated in FIG. 1. The changeover switch 80 selects either a sub clock SCLK or a selection signal SEL according to a switch control signal SW to output to each selector 82. For example, the switch control signal SW is output by a CPU 110 (FIG. 1). The sub clock SCLK is generated by a clock generation circuit 150 (FIG. 1) under control of the CPU 110.

In a case of receiving the sub clock SCLK, each selector 82 connects any of three bit lines B (for example, B0, B1, and B2) of a memristor array 140 to a current-voltage conversion circuit 10. In a case of receiving the selection signal SEL, each selector 82 connects the bit line B indicated by the selection signal SEL to the current-voltage conversion circuit 10. Note that the selector 82 that does not receive the selection signal SEL does not operate and blocks connection between the bit line B and the current-voltage conversion circuit 10.

In this embodiment, in each of first read operation and second read operation, a detection operation of detecting a current flowing in each of the bit lines B as many as one-third of all the bit lines B of the memristor array 140 is performed three times. Therefore, it is possible to make a circuit scale of each of holding units SH2, SH4, and SH5, a difference circuit 30, an adder circuit 40, a maximum value detection circuit 50, and an address detection circuit 60 to about one-third of that in FIG. 1. Note that, FIG. 13 illustrates an example in which the bit lines B are divided into three bit line groups and the detection operation is performed three times for the bit line groups, respectively. However, it is sufficient that the number of divisions of the bit lines B is two or larger. In the example illustrated in FIG. 13, the bit lines B of each bit line group are allocated every three lines.

An address storage circuit 84 stores addresses AD1, AD2, and AD3 indicating candidates of a nearest-neighbor vector detected by the detection operations of three times, respectively. The address storage circuit 84 outputs the detected three addresses AD1 to AD3 to the selection signal generation circuit 86 after completion of the operations of three times. The selection signal generation circuit 86 generates a selection signal SEL indicating the three bit lines B indicated by the three addresses AD1 to AD3 received from the address storage circuit 84. The changeover switch 80 and the selection signal generation circuit 86 are an example of a selection unit that allows a selector 82 to select the bit line B corresponding to a maximum voltage MAX of sum voltages SUM.

Then, after the detection operations of three times, the first read operation and the second read operation are executed for the three bit lines B connected to a memristor R that holds the bit values of the candidates of the nearest-neighbor vector detected in each detection operation. Then, the maximum value detection circuit 50 detects the maximum voltage MAX from the three sum voltages SUM corresponding to the three bit lines B. The address detection circuit 60 outputs the address AD indicating the bit line B in which the maximum voltage MAX is detected among the addresses AD of the three bit lines B.

As described above, in this embodiment also, as in the above-described embodiment, it is possible to detect the nearest-neighbor vector by using one memristor array 140, and reduce a circuit scale of the computer 100D. Moreover, in this embodiment, the bit lines B are divided into a plurality of bit line groups, and the candidate of the nearest-neighbor vector is detected for each of the bit line groups. Therefore, the circuit scale of peripheral circuits such as the holding units SH2, SH4, and SH5, the difference circuit 30, and the adder circuit 40 connected to the memristor array 140 may be reduced as compared with that in FIG. 1. As a result, a size of a semiconductor chip on which the memristor array 140 is mounted may be reduced, and a cost of the computer 100D may be reduced.

FIG. 14 illustrates an example of a computer according to another embodiment. Elements similar to those in the above-described embodiment are denoted by the same reference signs, and detailed description is omitted. Furthermore, as for an operation similar to that in the above-described embodiment, detailed description is omitted.

A computer 100E illustrated in FIG. 14 is mounted on a system SYS together with a storage 200 for long-term storage. The storage 200 is a hard disk drive (HDD), a solid state drive (SSD), a memory on a cloud or the like. The computer 100E includes a CPU 110E, a holding unit 120E that holds a seed information vector, a huge memory database 140E for short-term storage, and a holding unit 70E that holds a detected nearest-neighbor vector or information indicating the nearest-neighbor vector.

For example, the holding unit 120E corresponds to the input vector buffer 120 in FIG. 1. The memory database 140E corresponds to the memristor array 140 and the peripheral circuits thereof in FIG. 1. The holding unit 70E corresponds to the detection result output circuit 70 illustrated in FIG. 1. The storage 200 holds a vector to be compared, and transfers the vector to be compared that is compared next to the memory database 140E each time a detection operation is executed by using the memory database 140E.

For example, the system SYS illustrated in FIG. 14 serves as a next-generation computer for associative retrieval and the like in a brain-type computer. As described above, in this embodiment also, as in the above-described embodiment, it is possible to detect the nearest-neighbor vector by using the memristor array 140, and reduce a circuit scale of the computer 100E.

From the detailed description above, characteristics and advantages of the embodiments will become apparent. This intends that claims cover the characteristics and advantages of the embodiment described above without departing from the spirit and the scope of claims. Furthermore, one of ordinary knowledge in the technical field may easily achieve various improvements and modifications. Therefore, there is no intention to limit the scope of the inventive embodiments to those described above, and the scope of the inventive embodiment may rely on appropriate improvements and equivalents included in the scope disclosed in the embodiment.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:
1. A computer comprising:
a memristor array including memristors, the memristors being arranged at intersections between a plurality of word lines and a first bit line in the memristor array and being arranged at intersections between the plurality of word lines and a plurality of second bit lines in the memristor array;
an adder circuit configured to obtain sum voltages for the plurality of second bit lines by adding a plurality of first voltages to difference voltages, the plurality of first voltages being voltages generated according to currents that flow in the plurality of second bit lines when a first pattern is supplied to the plurality of word lines, the difference voltages being voltages between a reference voltage generated according to a current that flows in the first bit line when a second pattern is supplied to the plurality of word lines and a plurality of second voltages generated according to currents that flow in the plurality of second bit lines when a second pattern is supplied to the plurality of word lines; and
a detection circuit configured to detect a second bit line that corresponds to a maximum value of the sum voltages.
2. The computer according to claim 1, wherein
the memristors arranged at the intersections between the plurality of word lines and the first bit line are set to a low-resistance state,
the memristors arranged at the intersections between the plurality of word lines and the plurality of second bit lines are set to a resistance state that corresponds to a pattern to be compared that is compared with the first pattern, and
the second pattern is an inverted pattern of the first pattern.
3. The computer according to claim 2, wherein
the first pattern is an input vector, and
the pattern to be compared stored in the memristors connected to the second bit line that corresponds to the maximum value of the sum voltages is a nearest-neighbor vector closest to the input vector.
4. The computer according to claim 1, the computer comprising:
a plurality of memristor arrays logically two-dimensionally arranged, wherein the adder circuit obtains the sum voltages for each of columns of the memristor arrays arranged in a first direction, and the detection circuit includes:
- a plurality of first maximum value detection circuits that obtains maximum values of the sum voltages for the respective columns,
- a second maximum value detection circuit that obtains a maximum value among the maximum values for the respective columns obtained by the plurality of first maximum value detection circuits, and
- an address detection circuit that detects an address that indicates the second bit line that corresponds to the maximum value obtained by the second maximum value detection circuit.

5. The computer according to claim 1, the computer comprising:
- a first holding circuit that holds the plurality of first voltages;
- a second holding circuit that holds the reference voltage and the plurality of second voltages;
- a difference circuit that obtains difference voltages between the reference voltage held by the second holding circuit and the plurality of second voltages, respectively; and
- a third holding circuit that holds the difference voltages, so as to correspond to the memristor array.

6. The computer according to claim 5, comprising:
- a fourth holding circuit of at least one stage that sequentially holds the plurality of first voltages held by the first holding circuit, wherein the adder circuit adds the plurality of first voltages held by the fourth holding circuit in a final stage to the plurality of difference voltages.

7. The computer according to claim 1, comprising:
- a current-voltage conversion circuit that converts currents that flow in the first bit line and the plurality of second bit lines into voltages, respectively, according to data stored in each of the memristors when the plurality of word lines is driven; and
- a changeover switch that supplies a ground voltage to a ground terminal of the current-voltage conversion circuit when the first pattern is supplied to the plurality of word lines and supplies a bias voltage higher than the ground voltage to the ground terminal of the current-voltage conversion circuit when the second pattern is supplied to the plurality of word lines, wherein the first pattern and the second pattern are the same as each other.

8. The computer according to claim 1, the computer comprising:
- the current-voltage conversion circuit that converts the currents that flow in the first bit line and the plurality of second bit lines into the voltages, respectively, according to the data stored in each of the memristors when the plurality of word lines is driven;
- a selector that connects any one of a plurality of bit line groups that includes a predetermined number of the second bit lines among the plurality of second bit lines to the current-voltage conversion circuit; and
- a selection unit that allows the selector to select the second bit line that corresponds to the maximum value of the sum voltages obtained by the detection circuit for each of the bit line groups.

9. A calculation method performed by a computer that includes a memristor array in which memristors are arranged at intersections between a plurality of word lines and a first bit line and at intersections between the plurality of word lines and a plurality of second bit lines, the calculation method comprising:
- generating a plurality of first voltages according to currents that flow in the plurality of second bit lines when a first pattern is supplied to the plurality of word lines;
- generating a reference voltage according to a current that flows in the first bit line and generating a plurality of second voltages according to currents that flow in the plurality of second bit lines, respectively, when a second pattern is supplied to the plurality of word lines;
- obtaining difference voltages between the reference voltage and the plurality of second voltages, respectively;
- adding the plurality of first voltages to the plurality of difference voltages, respectively, and obtaining sum voltages for the plurality of second bit lines; and
- detecting a second bit line that corresponds to a maximum value of the sum voltages.

* * * * *